US007952915B2

(12) United States Patent
Ono et al.

(10) Patent No.: US 7,952,915 B2
(45) Date of Patent: May 31, 2011

(54) CORE-ROTATING ELEMENT OF FERROMAGNETIC DOT AND INFORMATION MEMORY ELEMENT USING THE CORE OF FERROMAGNETIC DOT

(75) Inventors: Teruo Ono, Uji (JP); Shinya Kasai, Uji (JP); Kensuke Kobayashi, Uji (JP); Yoshinobu Nakatani, Funabashi (JP); Hiroshi Kohno, Minoh (JP); Gen Tatara, Hachioji (JP)

(73) Assignees: Kyoto University, Kyoto (JP); The University of Electro-Communications, Tokyo (JP); Osaka University, Osaka (JP); Tokyo Metropolitan University, Tokyo (JP)

( * ) Notice: Subject to any disclaimer, the term of this patent is extended or adjusted under 35 U.S.C. 154(b) by 251 days.

(21) Appl. No.: 12/224,485

(22) PCT Filed: Mar. 1, 2007

(86) PCT No.: PCT/JP2007/000154
§ 371 (c)(1),
(2), (4) Date: Oct. 15, 2008

(87) PCT Pub. No.: WO2007/105358
PCT Pub. Date: Sep. 20, 2007

(65) Prior Publication Data
US 2009/0180311 A1  Jul. 16, 2009

(30) Foreign Application Priority Data

Mar. 2, 2006  (JP) ................................ 2006-056174
Aug. 2, 2006  (JP) ................................ 2006-211432

(51) Int. Cl.
*G11C 11/00* (2006.01)
(52) U.S. Cl. ......................... 365/158; 365/171; 365/173

(58) Field of Classification Search .................. 365/158, 365/171, 173
See application file for complete search history.

(56) References Cited

U.S. PATENT DOCUMENTS 6,172,902 B1 * 1/2001 Wegrowe et al. ............. 365/158
(Continued)

FOREIGN PATENT DOCUMENTS

JP  A-2002-374019  12/2002
(Continued)

OTHER PUBLICATIONS

Shinjo et al.; "Magenetic vortex core observation in circular dots of permalloy"; *Science*; Aug. 11, 2000; pp. 930-932; 289.
(Continued)

*Primary Examiner* — Pho M Luu
(74) *Attorney, Agent, or Firm* — Oliff & Berridge PLC

(57) ABSTRACT

A novel element capable of simply controlling an in-plane rotational motion of a core (a rising spot of a magnetization) generated in the center of a ferromagnetic dot made by forming a ferromagnetic material into a nanosized disk shape is provided. In addition, a binary information memory element using a core, including a ferromagnetic dot, made of a disk-shaped ferromagnetic material, with a magnetic structure of a magnetic vortex structure, and a current supplier for supplying an alternating current with a predetermined alternating current in the radial direction of the ferromagnetic dot is provided. In the case where the frequency of the current resonates with the intrinsic frequency of the ferromagnetic dot, it is possible to rotate the core in the plane of the dot. Since the core leaks a magnetic field, a microscopic actuator such as a motor can be obtained by using this element. Furthermore, supplying a current having a density not less than a predetermined value reverses the core. This allows the expression of binary information.

21 Claims, 15 Drawing Sheets

U.S. PATENT DOCUMENTS

| | | | |
|---|---|---|---|
| 6,654,278 B1 | 11/2003 | Engel et al. | |
| 6,906,369 B2 * | 6/2005 | Ross et al. | 257/295 |
| 6,980,469 B2 * | 12/2005 | Kent et al. | 365/171 |
| 7,002,839 B2 * | 2/2006 | Kawabata et al. | 365/171 |
| 7,307,876 B2 * | 12/2007 | Kent et al. | 365/171 |
| 7,593,184 B2 * | 9/2009 | Clinton et al. | 360/125.01 |

FOREIGN PATENT DOCUMENTS

| | | |
|---|---|---|
| JP | A-2004-363350 | 12/2004 |
| JP | A-2005-535115 | 11/2005 |
| WO | WO 2004/109805 | 12/2004 |

OTHER PUBLICATIONS

Guslienko et al.; "Eigenfrequencies of vortex state excitations in magnetic submicron-size disks"; *Journal of Applied Physics*; May 15, 2002; pp. 8037-8039; 91-10.

Cowburn et al.; "Single-domain circular nanomagnets"; *Physical Review Letters*; Aug. 2, 1999; 83-5.

Shibata et al.; "Current-induced magnetic vortex motion by spin-transfer torque"; *Physical Review*; 2006; pp. 1-4; B-73.

* cited by examiner

DIRECTION OF A MAGNETIZATION IN THE CENTER

REFERENCE VALUES $R_{FM1}=1\ \mu m$
$t_{FM1}=40\ nm$
$R_{FM2}=50\ nm$
$RA=100\ \Omega(\mu m)^2$
$r_{TMR}=1(100\%)$

GAIN EVALUATION

INPUT SIDE $\quad V_{in}=0.25V$
$I_{ac}=5mA,\ J_{ac}=1.3\times 10^{11}\ A/m^2$

OUTPUT SIDE $\quad I_{ac}=0.1mA,\ V_{out}=1.5\pm 0.5V$ $$gain=20\log(\frac{0.5V}{0.25V})=6dB$$

CURRENT DIRECTION ROTATES OVER TIME $J_1 = J_0 \sin(\omega t)$
$J_2 = -J_0 \cos(\omega t)$

FIRST CURRENT SUPPLIER
SECOND CURRENT SUPPLIER

"0"  "1"

CORE-ROTATING ELEMENT OF FERROMAGNETIC DOT AND INFORMATION MEMORY ELEMENT USING THE CORE OF FERROMAGNETIC DOT

TECHNICAL FIELD

The present invention relates to an element capable of controlling the rising spot (which is referred to as "core") of a magnetization (i.e. magnetic moment) on a disk-shaped ferromagnetic material (which is called "ferromagnetic dot"). More precisely, it relates to an elemental device capable of controlling the circular motion of the core by the application of a current, and to an information memory element using the motion of the core.

BACKGROUND ART

It is known that a disk-shaped ferromagnetic material having a diameter of approximately a few μm and thickness of a few dozen nm has a magnetic vortex structure in which a magnetic structure winds around the circumference of the disk. In the present invention, a ferromagnetic material having such a structure is called "a ferromagnetic dot." In the vicinity of the center of this ferromagnetic dot, a magnetization rises, in a microscopic area with a diameter of approximately 10 nm, in a direction perpendicular to the plane of the disk (for example, refer to Non-Patent Document 1). In the present invention, the area where the magnetization rises in a perpendicular direction is called "a core."

Previous researches have revealed that if a magnetic field is applied to such a ferromagnetic dot in a radial direction of the dot, the position of the ferromagnetic dot's core changes and if the application of the magnetic field is halted, the core while exhibiting a spiral motion returns to the center of the ferromagnetic dot. In addition, it is known that if the magnetic field to be applied is an alternating current magnetic field which resonates with the rotational period of the core, the core exhibits a rotational motion with a given diameter in the plane of the ferromagnetic dot (for example, refer to Non-Patent Document 2).

[Non-Patent Document 1] Shinjo, T., et al., "Magnetic vortex core observation in circular dots of permalloy," *Science*, 289, 930-932 (2000).

[Non-Patent Document 2] Guslienko, K. Yu, et al., "Eigenfrequencies of vortex state excitations in magnetic submicron-size disks," *J. Appl. Phys.*, 91, 8037-8039 (2002).

[Non-Patent Document 3] R. P. Cowburn, et al., "Single-Domain Circular Nanomagnets," *Physical review letters* 83, No 5, 1042-1045 (1999).

[Non-Patent Document 4] 25. Shibata, J., et al., "Current-induced magnetic vortex motion by spin-transfer torque," *Phys. Rev.*, B 73, 020403 (2006).

DISCLOSURE OF THE INVENTION

Problem to be Solved by the Invention

As just described, the control of the circular motion of the core in a ferromagnetic dot has been conventionally performed by applying a magnetic field. The inventors of the present invention have devoted research in this technical field, with the aim of performing more simply the control of the core. As a result, they have discovered that the circular motion of the core can be controlled with a current.

Means for Solving the Problem

To solve the previously-described problem, the present invention provides a core-rotating element of a ferromagnetic dot, including:

a ferromagnetic dot, made of a disk-shaped ferromagnetic material, with a magnetic structure of a magnetic vortex structure; and a current supplier for supplying, in a radial direction of the ferromagnetic dot, an alternating current with a substantially same frequency as a resonant frequency of the ferromagnetic dot.

Effect of the Invention

With the core-rotating element of a ferromagnetic dot according to the present invention, it is possible to use an electric current to control the core's rotation, which has been required to be controlled with an external magnetic field. Therefore, a microscopic circular motion can be generated with a very simple configuration. Since the resonant frequency can be controlled with a variety of parameters such as the shape of the ferromagnetic dot, it is possible to design a rotating element in accordance with the purpose.

BEST MODE FOR CARRYING OUT THE INVENTION

A ferromagnetic dot which can be used in the present invention is made of a disk-shaped ferromagnetic material. The material may preferably be permalloy for example. However, the material is not limited thereto and may be any substance as long as it is a ferromagnetic material. The rotational property of the core changes in accordance with the material of the ferromagnetic material. This relationship between the ferromagnetic material and the rotational property of the core can be understood by the second formula of the Landau-Lifshits-Gilbert (LLG) equation which will be described later. That is, when the saturation magnetization Ms becomes smaller, $u_s$ becomes larger, which enlarges the rotational radius of a core. In addition, in the case where P, which is another material constant, becomes larger, $u_s$ becomes larger, and the rotational radius of a core enlarges.

Figure 30:
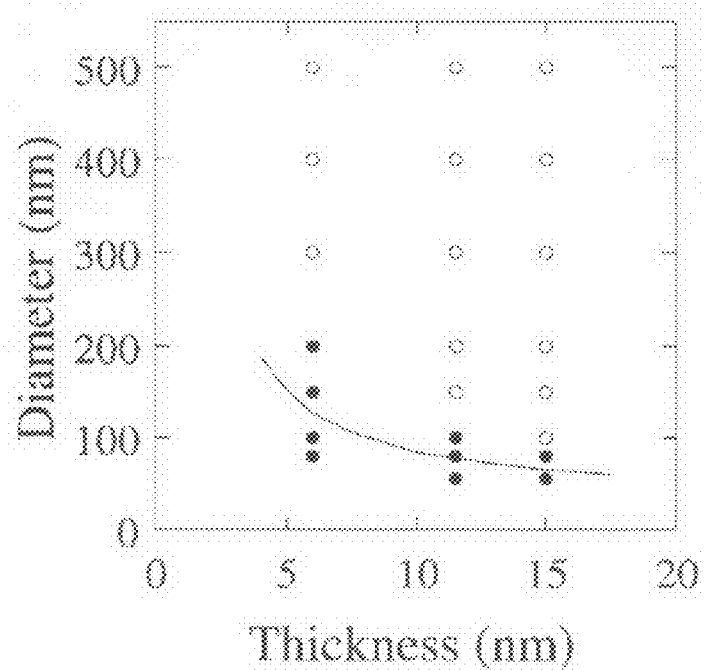
FIG. 30 is a diagram illustrating the relationship between the thickness and diameter for a magnetic vortex structure generated in a circular ferromagnetic dot.

A ferromagnetic dot may be any size as long as its magnetic structure swirls on the plane of the dot, i.e. it shows a magnetic vortex structure, in a stable state. The "stable state" means the state where an external magnetic field is not applied nor is current supplied. FIG. 30 illustrates theoretical values, disclosed in Non-Patent Document 3, of the relationship between the thickness and diameter in which a magnetic vortex structure is generated in a circular ferromagnetic dot. The area indicated with white circular dots in FIG. 30 is the range of the relationship between the thickness and diameter for a stable magnetic vortex structure. The ferromagnetic dot according to the present invention may be designed by referring to the relationship between the thickness and diameter which has been conventionally known. However, a larger diameter or thickness of a ferromagnetic dot in practice prevents the magnetic vortex structure. Given this factor, the ferromagnetic dot in the element according to the present invention may preferably have a planar shape of a substantially circular form with a diameter of not more than 50 μm and have a thickness of not more than 1 μm.

The planer shape of the ferromagnetic dot is not limited to a circle but can be an ellipse. That is, the ferromagnetic dot can exhibit a magnetic vortex structure also in the case where it is elliptic. Therefore, the "disk-shaped" reference in the present invention is a concept also including an ellipse. In addition, some irregularities on the edge of the disk can be allowed.

In the case where the ferromagnetic dot has an elliptical shape, the core shows a circular motion in an elliptical orbit. The shape (i.e. thickness and diameter) may be designed in accordance with the purpose, since the rotational radius and resonance frequency of the core changes according to its shape. It is conventionally known that the resonance frequency of a ferromagnetic dot is determined by the ratio of the thickness to radius of the ferromagnetic dot (for example, refer to Non-Patent Document 2).

The current supplier supplies an alternating current in the radial direction of a ferromagnetic dot. Normally it is composed of electrodes provided at both ends in the radial direction of a ferromagnetic dot (refer to FIG. 1). The frequency of the current supplied by this current supplier is set to be the resonance frequency of the ferromagnetic dot. Since the core's rotational radius changes in correspondence to the current density of the current supplied by the current supplier, the current density may be appropriately adjusted in order to obtain a desired rotational radius.

Hereinafter, the experiment that the inventors of the present invention have carried out will be explained.

Figure 1:
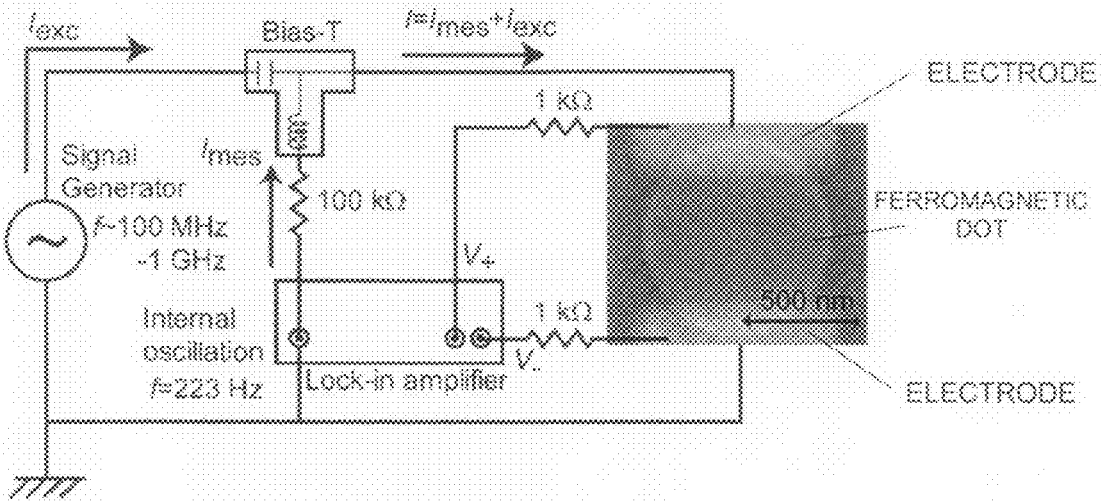
FIG. 1 is a circuit diagram of a measurement system including the scanning electron microscope image of a ferromagnetic dot according to the present invention.

FIG. 1 illustrates a circuit diagram of a measurement system including the scanning electron microscope image of a ferromagnetic dot according to the present invention. In the present experiment, permalloy ($Fe_{19}Ni_{81}$) was used as the material of the ferromagnetic dot. The existence of a core in the center portion of the ferromagnetic dot was confirmed by a magnetic force microscopy.

(Simulation)

Micromagnetic simulations based on the following LLG equation were performed:

$$\frac{\partial m}{\partial t} = -\gamma_0 m \times H_{eff} + \alpha m \times \frac{\partial m}{\partial t} - (u_s \cdot \nabla)m$$

$$u_s = \frac{g\mu_B jP}{2eM_s}$$

where, m is the unit vector along the local magnetization, $\gamma_0$ is the gyromagnetic ratio, $H_{eff}$ is the effective magnetic field, $\alpha$ is the Gilbert damping constant, j is the current density, P is the spin polarization degree, g is the g value of an electron, $\mu_B$ is the Bohr magneton, e is the elementary electric charge, and $M_s$ is the saturation magnetization.

In the simulation, a ferromagnetic dot was divided into square pole elements, each having a size of $4 \times 4 \times 40$ $nm^3$. The direction of the magnetization in each element was presumed to be uniform. The physical constants used were typical ones for permalloy: $M_s$=1T, exchange stiffness constant A=1.0× $10^{-11}$ J/m, P=0.7, $\alpha$=0.01. An alternating current expressed by j=$J_0$ sin $2\pi ft$ was supplied.

Figure 2:
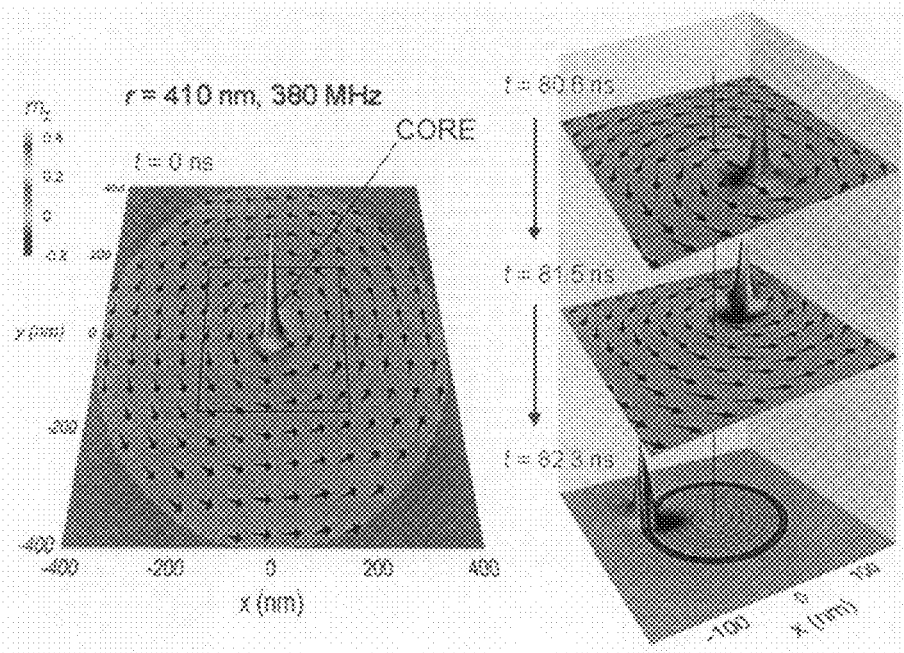
FIG. 2 is a simulation result illustrating the motion of the core of the ferromagnetic dot.

First, $f_0$, which is the eigenfrequency (resonance frequency) of the circular motion of the core, was calculated by calculating the free relaxation motion carried out by the core located out of the center of the ferromagnetic dot. Next, the simulation was carried out by supplying an alternating current at the eigenfrequency. FIG. 2 is a diagram illustrating the time variation for the sample of 410 nm in radius and 40 nm in thickness in the case where the alternating current having the frequency f=$f_0$=380 MHz and the current density $J_0$=3× $10^{11}$ $A/m^2$ was supplied to the sample.

When a current is supplied to the ferromagnetic dot, the core first moves in the direction of the electron flow, i.e. a spin current direction. This motion originates from the spin-transfer effect. A restoring force toward the center acts on the core which is off the center of the ferromagnetic dot. However, due to the gyroscopic nature of the vortex (i.e. since the vortex moves perpendicularly to the restoring force), the core makes a circular motion around the ferromagnetic dot's center as a rotation center. This circular motion is stabilized where the spin-transfer from the current is balanced with the restoring force (see the lower-right illustration of FIG. 2). The direction of the circular motion depends on that of the magnetization of the core. The radius of the steady orbital is incomparably larger than that in the case where the core is rotated by a direct current having the same amplitude (refer to Non-Patent Document 4).

Figure 3:
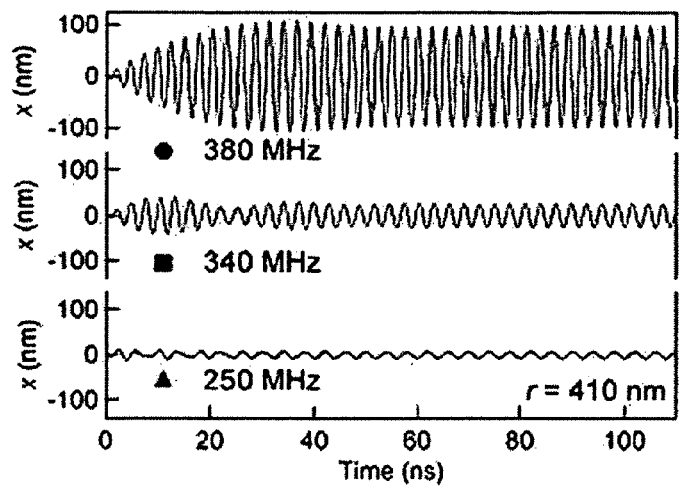
FIG. 3 is a graph illustrating the core's displacement in a radial direction over time, with respect to supplied currents having different frequencies.

The x-direction (i.e. diametrical direction) displacement of the core with respect to the time variation was calculated with respect to three different frequencies f=250, 340, and 380 MHz of the supplied current. FIG. 3 illustrates the result of this simulation. For f=380 MHz, the circular motion of the core became steady after approximately 60 ns. For f=340 MHz which is slightly off the resonance frequency of $f_0$=380, the amplification appeared first, however, the displacement became smaller with the stabilization of the circular motion of the core. For f=250 MHz, the core showed only a weak motion.

Figure 4:
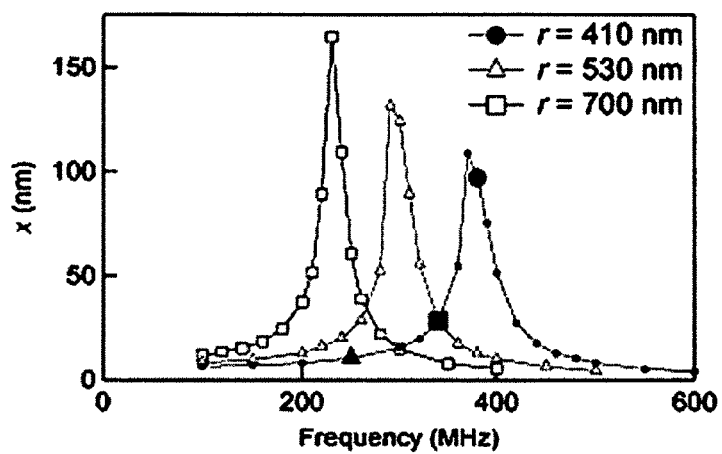
FIG. 4 is a graph illustrating the magnitude of the core's displacement in a radial direction with respect to the change of the frequency of the supplied current with respect to the different radii of the ferromagnetic dot.

FIG. 4 illustrates the calculation result of the x-direction displacement of the steady orbital with respect to the change of the frequency for each radius of the ferromagnetic dot of 410, 530, and 700 nm. It is understood that the resonance frequency changes corresponding to the size of the ferromagnetic dot's radius.

Figure 5:
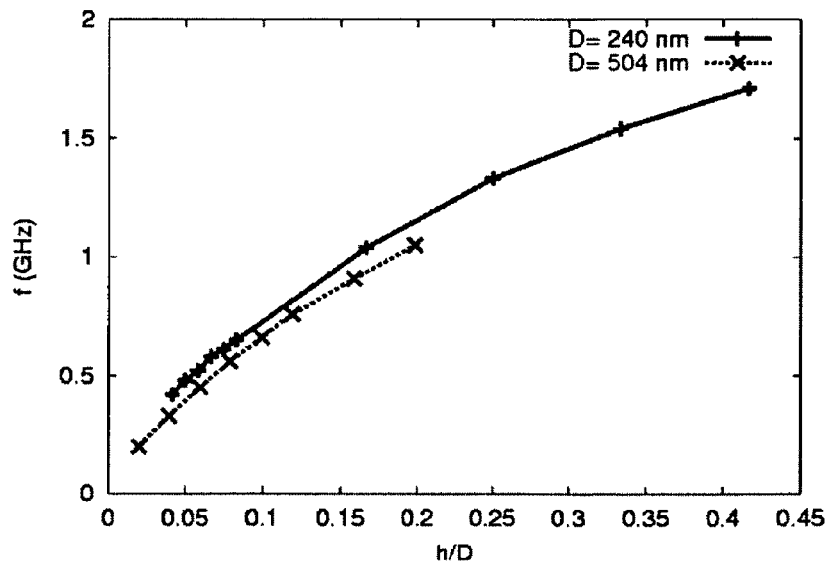
FIG. 5 is a graph illustrating the simulation calculation result showing the relationship between the ratio of the thickness to diameter and the resonance frequency for the ferromagnetic dots with a diameter of 240 nm and 504 nm.

FIG. 5 is a simulation calculation result illustrating the relationship between the ratio of the thickness (h) to diameter (D) and the resonance frequency for the ferromagnetic dots with a diameter of 240 nm and 504 nm in the case where the thickness was changed from 10 through 60 nm. The material constants used were those of permalloy: Ms=800 $emu/cm^3$, A=1×$10^{-6}$ erg/cm, Ku=0, $\alpha$=0.01. It is shown that the resonance frequency becomes higher as the ferromagnetic dot becomes thicker.

"The resonance frequency of a ferromagnetic dot" in the present specification means the frequency in the case where the rotational frequency of a core existing on the ferromagnetic dot resonates with the frequency of the supplied current. When a current having such a frequency is supplied, the core rotates with the highest efficiency.

(Confirmation by Experiment)

The rotation of the core of the ferromagnetic dot according to the present invention was experimentally confirmed using the anisotropic magnetoresistance (AMR) effect in which the electrical resistance of ferromagnetic metals changes depending on the flow direction of a current.

Figure 6:
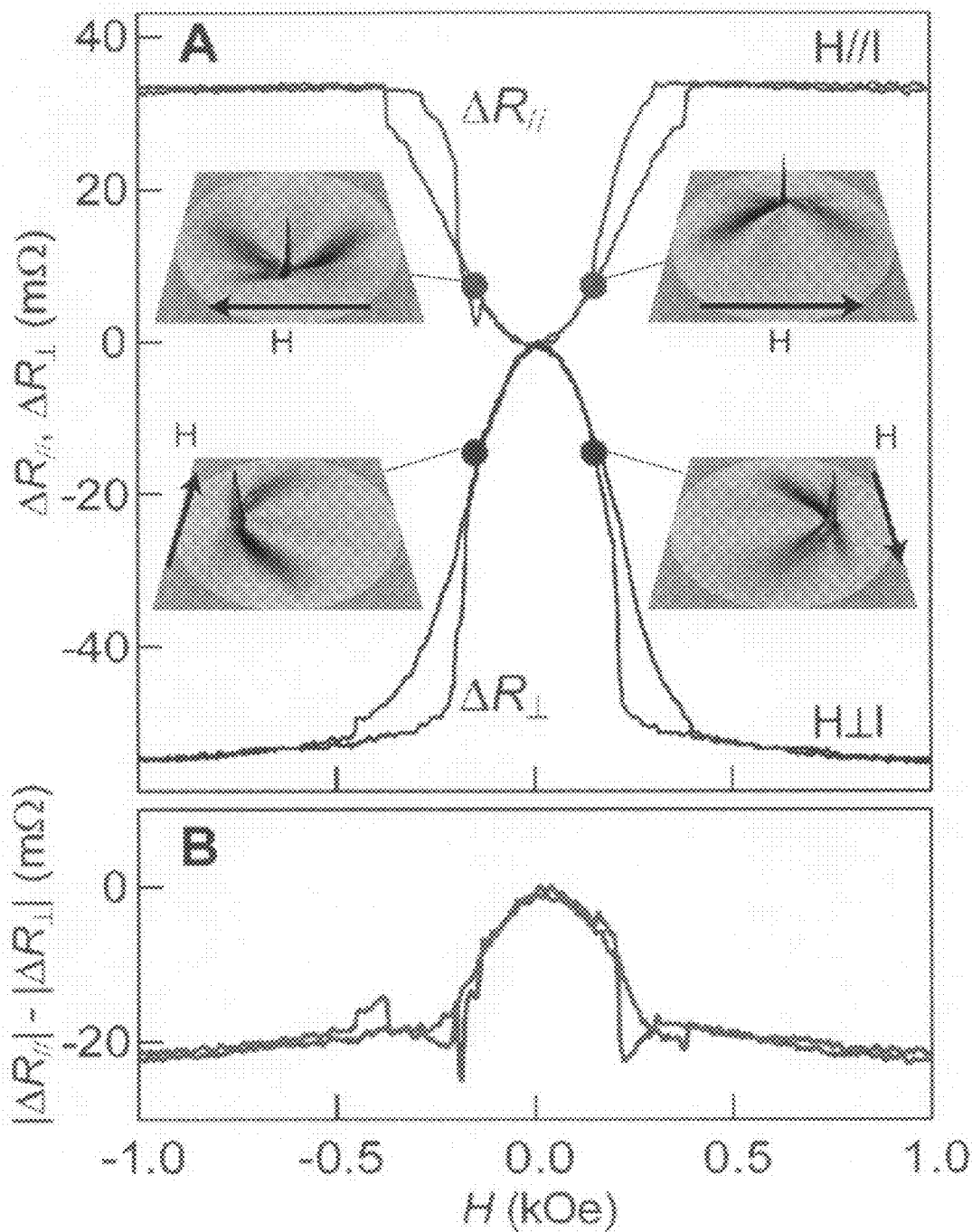
FIG. 6A is a graph illustrating the relationship between the magnitude of the magnetic field and the value of the resistance change in the cases where the magnetic field is applied parallel and perpendicularly to the current.
FIG. 6B is a graph illustrating the relationship between the magnitude of the magnetic field and the difference between the value of the resistance change in the case where the magnetic field is applied parallel and the value of the resistance change in the case where the magnetic field is applied perpendicularly.

The magnetoresistance of a ferromagnetic dot having a radius of 700 nm was measured at room temperature (FIG. 6). In FIG. 6A, a curve indicated by H//I illustrates a magnetoresistance in the case where a magnetic field H(Oe) is applied parallel to the current, and a curve indicated by H⊥I illustrates the case where a magnetic field is applied perpendicularly to the current. The magnetoresistance is a resistance change value indicating the resistance change from the state where a magnetic field is not applied. In FIG. 6A, the positions of the core under the external magnetic field are indicated by black dots. The resistance of the ferromagnetic dot is highly correlated with the core position because of the AMR effect.

The important feature in FIG. 6 is that the resistance change for H⊥I ($|\Delta R_\perp|$) is larger than that for H//I ($|\Delta R_{//}|$), as can be understood from FIG. 6B which illustrates the value of $|\Delta R_{//}|-|\Delta R_\perp|$. This difference in the resistance change results from the symmetry breaking because of the two electrodes attached to the ferromagnetic dot.

In the case where the core is on resonance and the measurement time is much longer than the period of the core orbital motion, the measured resistance value is the average value for all the core positions. This average resistance value is expected to be smaller than that for the off-resonance core existing around the center of the ferromagnetic dot because $(|\Delta R_{//}|-|\Delta R_\perp|)<0$. In this manner, the resonance of the core can be confirmed.

Figure 7:
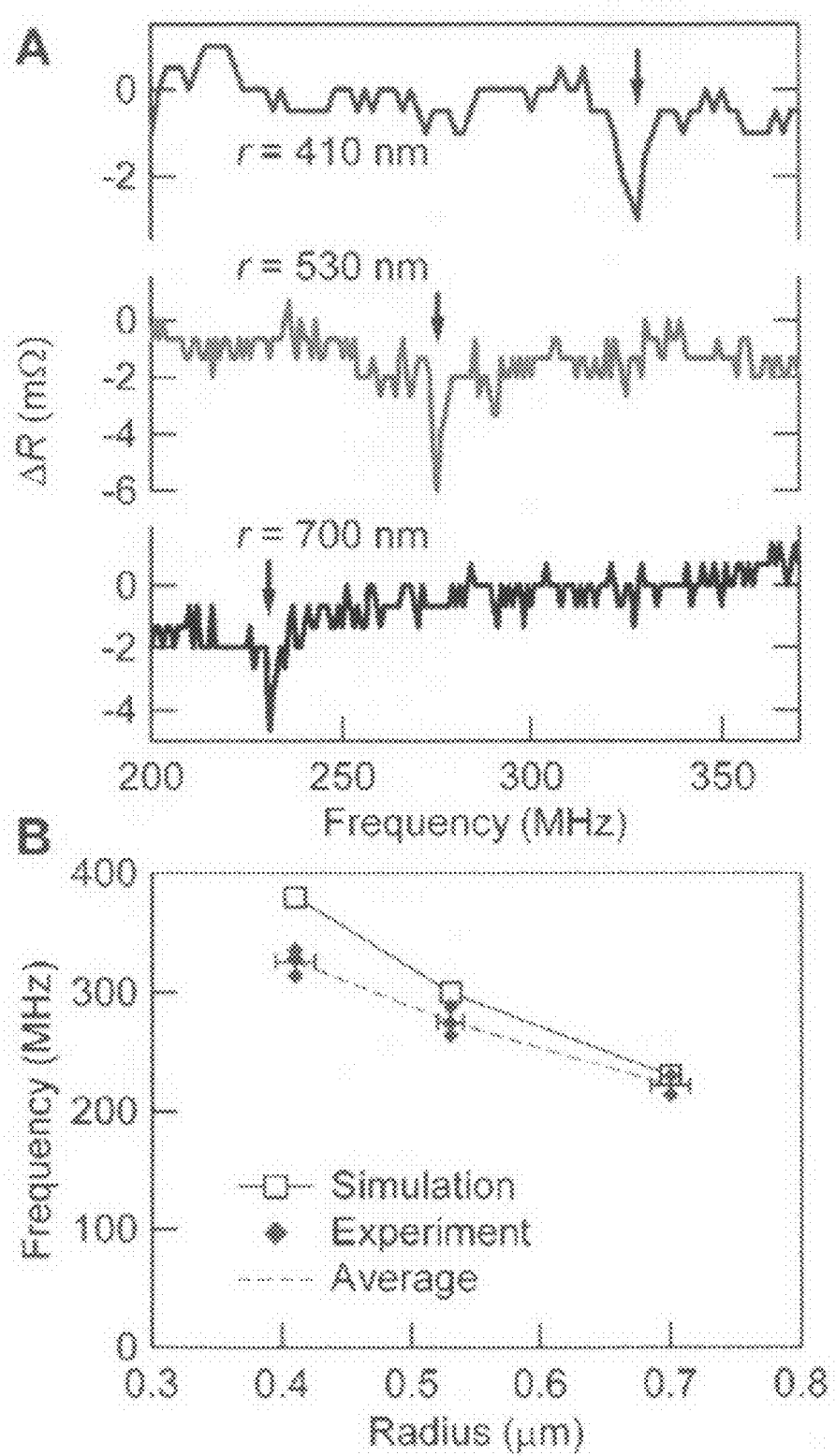
FIG. 7A is a graph illustrating the relationship between the frequency of the alternating current supplied to three ferromagnetic dots with different diameters and the value of the resistance change.
FIG. 7B is a graph illustrating the relationship between the ferromagnetic dot's radius and resonance frequency.

The resistance change value was measured in the case where an alternating current was supplied to the ferromagnetic dot, by using the circuit illustrated in FIG. 1. The measurement was performed by conventional lock-in techniques using a current of 15 μA with a frequency of 223 Hz. The current's density was 3×$10^{11}$ $A/m^2$. FIG. 7A is a graph illustrating the relationship between the frequency of the supplied alternating current and the resistance change value for each of the dots having a radius of 410, 530, and 700 nm. A clear dip is observed for the ferromagnetic dot of each size. This signifies the resonance.

Since the dip observed in this graph originates from the AMR effect in which the vortex orbital is averaged, the maximum value corresponding to the core motion along the ferromagnetic dot edge is expected to be approximately $(|\Delta R_{\parallel}|-|\Delta R_{\perp}|)/2 \approx -10$ m$\Omega$, in light of the result for the ferromagnetic dot with a radius of 700 nm illustrated in FIG. 6B. Hence, the observed amplification, 3 m$\Omega$, corresponds to the core orbital motion having a rotational radius of approximately $0.3r \approx 200$ nm. This amplification is in favorable agreement with the simulation result illustrated in FIG. 4.

FIG. 7B illustrates the relationship between the ferromagnetic dot's radius and resonance frequency. The result based on the experiment corresponds favorably to the simulation result. In particular, for the ferromagnetic dot having a radius of 700 nm, a fair agreement was observed.

As demonstrated by the experiment just described, in the core-rotating element of a ferromagnetic dot according to the present invention, the rotation of the core can be controlled in a simple manner, i.e. by supplying a current. In addition, since the accuracy of the theory (i.e. simulation) result is high, it is also possible to design an element having a desired property.

Figure 8:
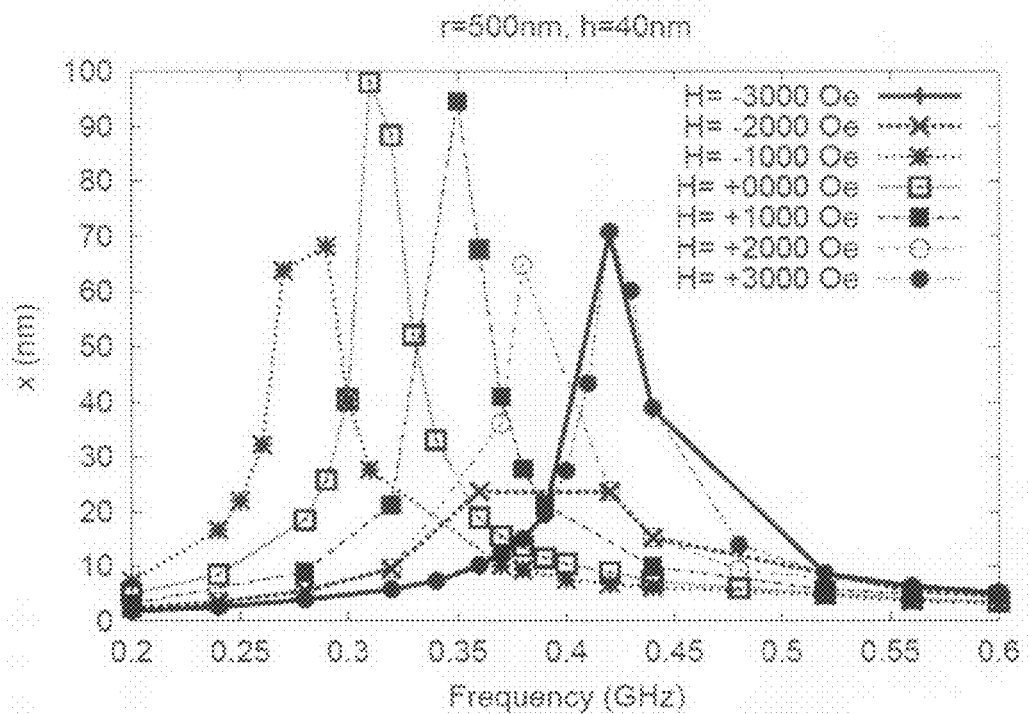
FIG. 8 is a graph illustrating the change of the resonance frequency for magnetic fields with different intensities supplied perpendicularly to the plane of the ferromagnetic dot.

In the core-rotating element of a ferromagnetic dot according to the present invention, the resonance frequency can also be controlled by externally applying a magnetic field substantially perpendicular to the plane of the dot. FIG. 8 illustrates the change of the resonance frequency (simulation result) of ferromagnetic dots having a radius of 500 nm and a thickness of 40 nm in the case where magnetic fields of 0, ±1000, ±2000, ±3000 Oe were respectively applied. It is understood that the resonance frequency has a tendency to become high with a high absolute value of the applied magnetic field.

Application Example

The core-rotating element of a ferromagnetic dot according to the present invention can be connected to various kinds of microscopic members using a magnetic field that leaks from the core. Therefore, it can be used as an actuator such as a stirring bar and motor. In particular, it is possible to make it function as a rotary power source for various kinds of micromachines and its application covers a wide range.

Figure 9:
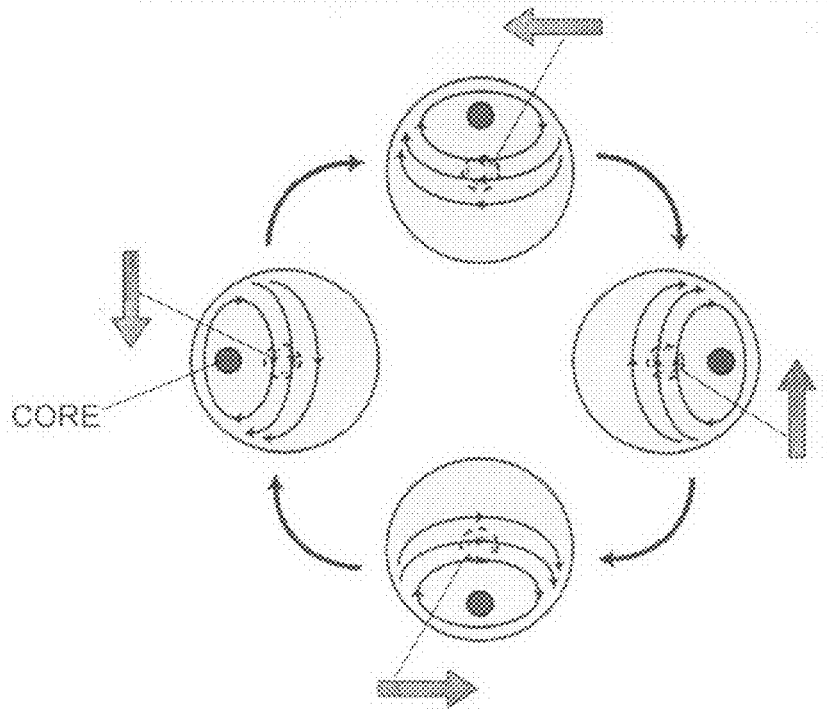
FIG. 9 is a schematic diagram illustrating the change of the magnetization's direction in the central area of the ferromagnetic dot in accordance with the rotation of the core.

A transistor can be created using the change of the magnetic vortex of the core-rotating element of a ferromagnetic dot according to the present invention. With the circular motion of a core, the direction of the magnetization in a certain area of the ferromagnetic dot changes. FIG. 9 illustrates a schematic diagram showing the magnetization's direction in the central area of the dot in accordance with the rotation of the core. With a circular movement of the core in the plane of the ferromagnetic dot in a clockwise direction such as: bottom→left→top→right→bottom, the magnetization's direction in the central area changes in a clockwise direction such as: rightward→downward→leftward→upward→rightward.

Figure 10:
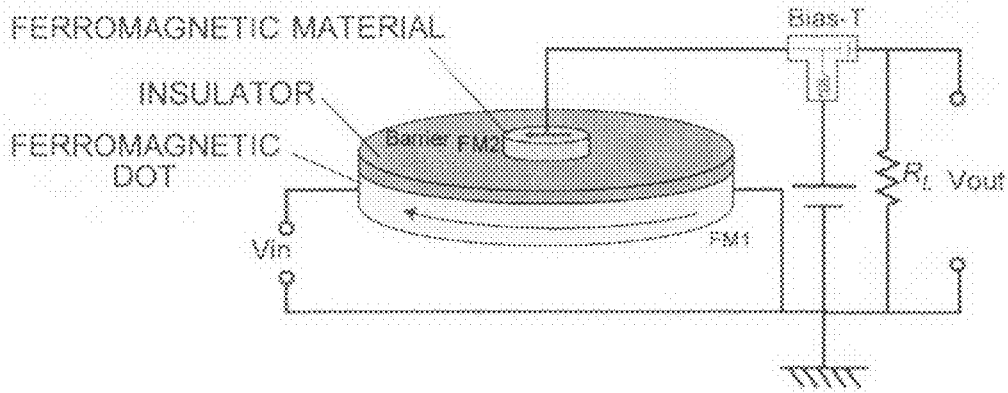
FIG. 10 illustrates a schematic diagram of the transistor using the TMR effect which is an application example of the ferromagnetic dot according to the present invention (upper portion), and its equivalent circuit (middle portion).
Figure 10:
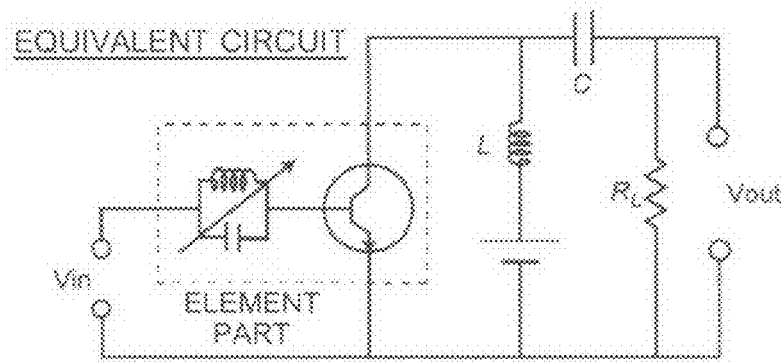

As illustrated in the upper portion of FIG. 10, it is possible to obtain what is called a tunnel magnetoresistance (TMR) element by providing an insulator having a thickness of approximately 1 nm on the surface of the core-rotating element of a ferromagnetic dot according to the present invention and providing a magnetic material with a constant direction of a magnetization in a partial area (central area in the present embodiment) on the insulator. In this configuration, supplying a predetermined current in the radius direction of the ferromagnetic dot rotates the magnetization's direction, as previously described, in the area corresponding to the bottom of the magnetic material. This creates a resistance change by the TMR effect. Therefore, with a circuit such as an equivalent circuit illustrated in the middle portion of FIG. 10 for example, it is possible to obtain a transistor capable of amplifying a voltage at a predetermined frequency, i.e. the resonance frequency of the ferromagnetic dot. In the example of FIG. 10, an approximate calculation shows that a double gain will be obtained, i.e. the output of $V_{out}$=1.5±0.5V with the input of $V_{in}$=0.25.

The TMR element with the aforementioned configuration can also be used as a filter which allows only a current with a predetermined frequency to pass through.

(Core Reversal in a Ferromagnetic Dot)

The inventors of the present invention have discovered that, in a core-rotating element of a ferromagnetic dot according to the present invention, supplying a current with a density not less than a predetermined threshold value for more than a predetermined period of time causes a reversal of the core direction with respect to the plane of the ferromagnetic dot. In the present invention, "the core direction" indicates the direction of the magnetization of a core. The direction of a core is either upward or downward perpendicularly to the plane of the ferromagnetic dot.

Figure 11:
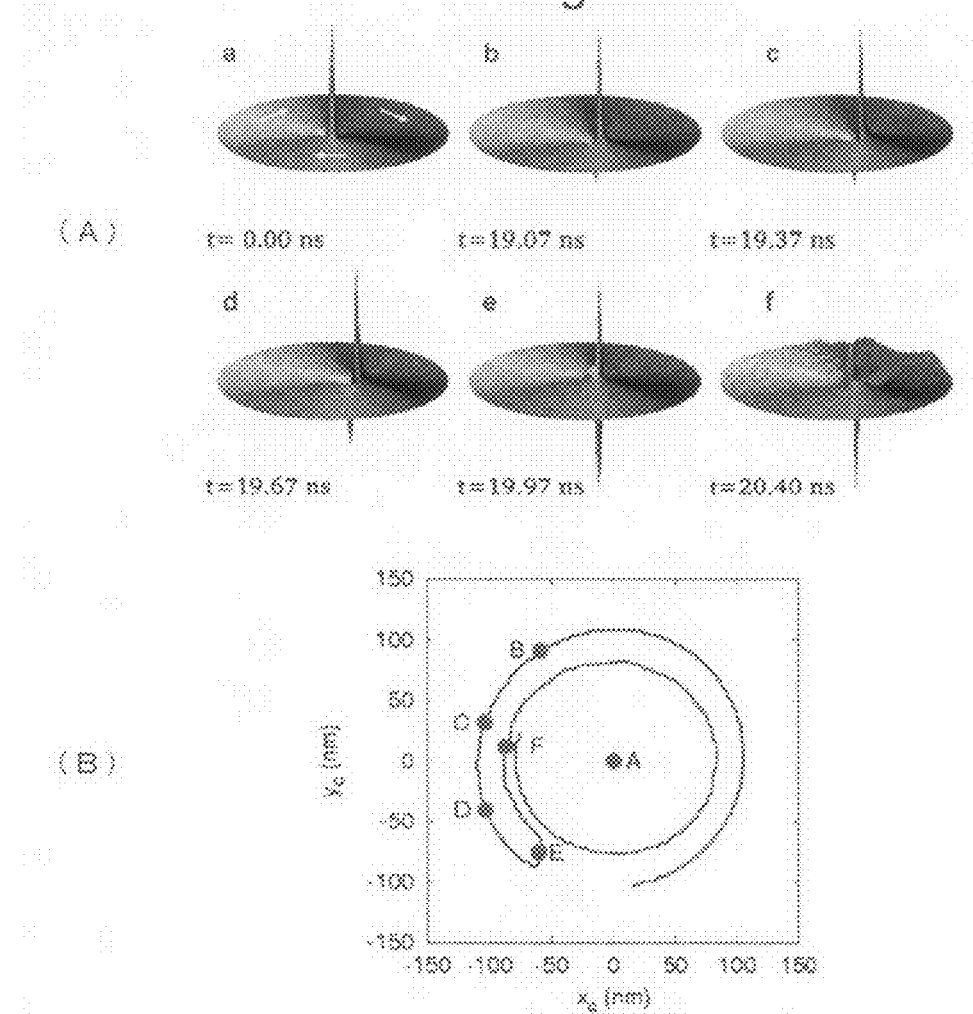
FIG. 11 illustrates: (A) a simulation diagram illustrating the core reversal phenomenon, and (B) a diagram illustrating the core position in the plane of the dot and its trajectory.

The core position and its direction were obtained by simulation for a ferromagnetic dot with a thickness of 50 nm and radius of 500 nm in the case where a current with a current density of $4.0 \times 10^{11}$ A/m$^2$ was supplied. The physical constants used were those of permalloy. The result is illustrated in FIG. 11(A). The figure under each illustration of a through f in FIG. 11(A) expresses the elapsed time from the point in time when a power supply was initiated. FIG. 11(B) is a diagram illustrating the core positions corresponding to a through f in FIG. 11(A) and the trajectory of the core for the elapsed time t=17.5 through 23 ns.

FIG. 11(A) shows that supplying a current rotates the core and generates a core reversal. FIG. 11(B) shows that the core reversal inverts the rotational direction of the core.

Figure 12:
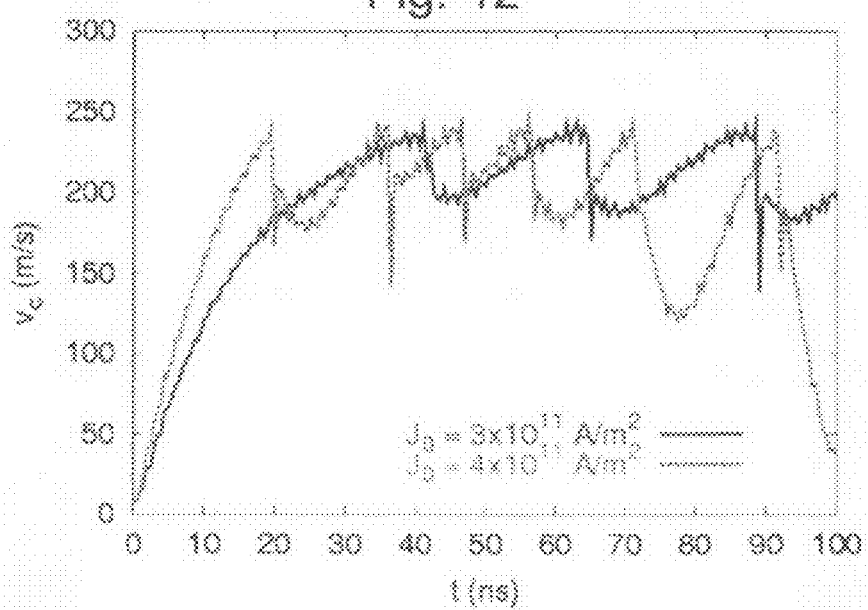
FIG. 12 is a graph illustrating the relationship between the current supply time and the core's rotational velocity.

FIG. 12 is a graph illustrating the relationship between the elapsed time and the core's rotational velocity in the case where the current supply initiation time was set to be t=0. In the graph of FIG. 12, core reversals take place at the points in time where the velocity sharply declines. In this experiment, two kinds of currents having a current density of $3.0 \times 10^{11}$ A/m$^2$ and that of $4.0 \times 10^{11}$ A/m$^2$ were used for comparison. The result shows that a core reversal takes place when the velocity reaches a given velocity (approximately 250 m/s in this experiment), regardless of the supplied current density.

Figure 13:
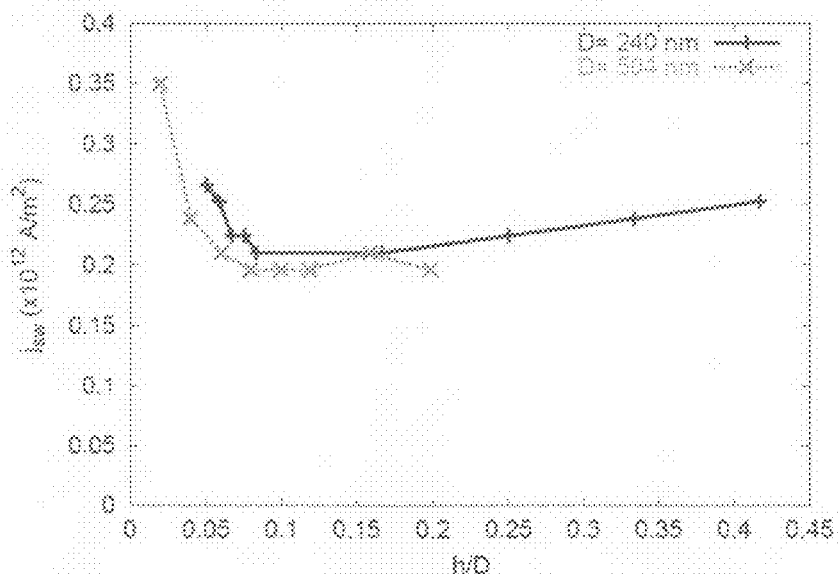
FIG. 13 is a graph illustrating the relationship between the size of a ferromagnetic dot and the current density required for a core reversal.

In addition, the inventors of the present invention have examined the relationship between the size of a ferromagnetic dot and the threshold value of a current required for a core reversal by a simulation calculation. FIG. 13 illustrates a graph showing the relationship between the size of a ferromagnetic dot and the current density required for a core reversal. The ferromagnetic dot used had a diameter of 240 nm and 504 nm, and a thickness of 10 through 60 nm. The material constants used were as follows: Ms=800 emu/cm$^3$, A=1×10$^{-6}$ erg/cm, Ku=0, $\alpha$=0.01. That is, it is possible to easily reverse the core direction by supplying a practical current having a density of approximately more than $0.2 \times 10^{12}$ A/m$^2$.

Next, the inventors of the present inventions have experimentally confirmed the core reversal phenomenon.

Figure 14:
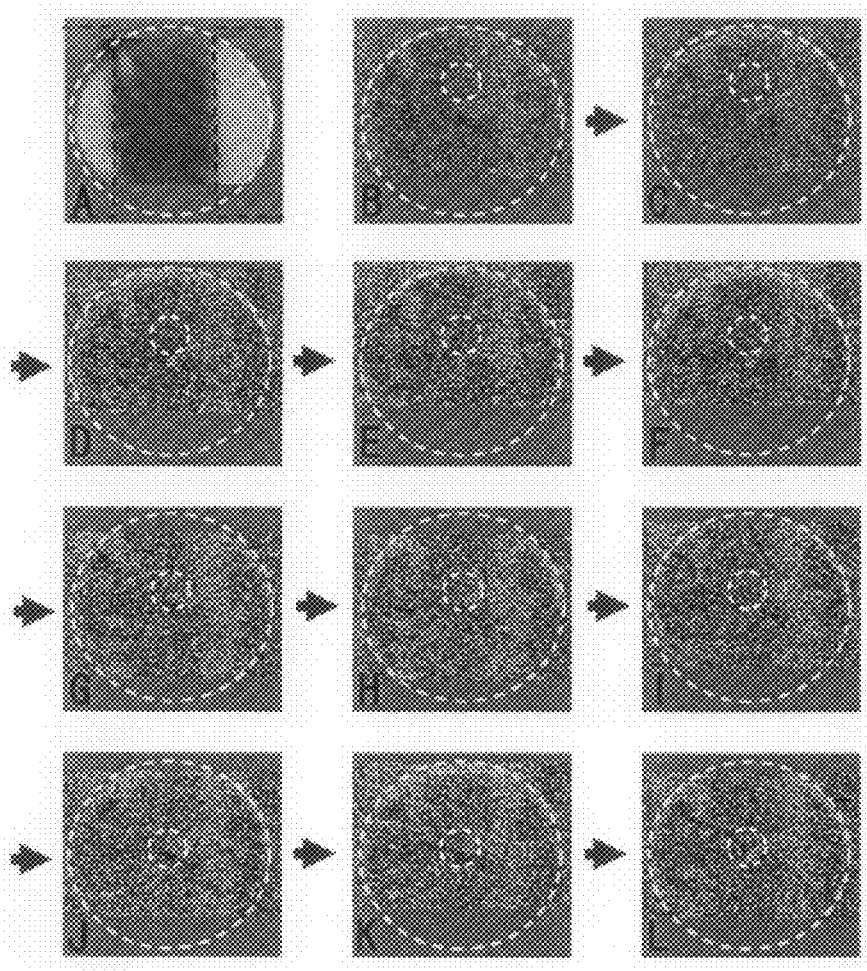
FIG. 14 illustrates: (A) an AFM image of a sample, (B) an MFM image of the sample, and (C) thorough (L) MFM images of the sample after each process of supplying a predetermined current for ten seconds.

FIG. 14(A) is an atomic force microscope (AFM) image of a sample. The ferromagnetic dot is provided in an area surrounded by a white dashed-line frame. On both sides of the ferromagnetic dot, electrodes are provided in the areas indicated by black dashed lines. An alternating current is provided to the ferromagnetic dot by way of these electrodes.

FIG. 14(B) is an observation image of the sample of FIG. 14(A) by a magnetic force microscope (MFM). A black spot is observed at the center (inside the white dashed-line circle) of the ferromagnetic dot, which indicates the existence of the core perpendicularly upward with regard to the paper plane.

FIG. 14(C) is an MFM observation image for the sample of FIG. 14(B) after a current with a frequency of 290 MHz and a current density of $3.5 \times 10^{11}$ A/m$^2$ was supplied for ten seconds. In this image, a black spot which existed at the center of the ferromagnetic dot has been changed into a bright spot. This indicates the reversal of the core direction.

Subsequently, the aforementioned current was supplied to the sample for ten seconds, then the sample was each time observed by the MFM, and this process was repeated. The MFM observation image for each process are illustrated in FIGS. 14(D) through (L). The arrows in FIG. 14 indicate that the current was supplied for ten seconds. The result illustrated in FIGS. 14(B) through (L) indicates the core direction as follows: (B) upward, (C) downward, (D) downward, (E) downward, (F) downward, (G) upward, (H) upward, (I) downward, (J) upward, (K) upward, and (L) downward. This shows that the core direction randomly changes after the supply of a current. That is, in this experiment, the core reversal takes place not less than once within a current supply time period (ten seconds) and the core direction is determined at a point in time when the supply of a current is halted.

Figure 15:
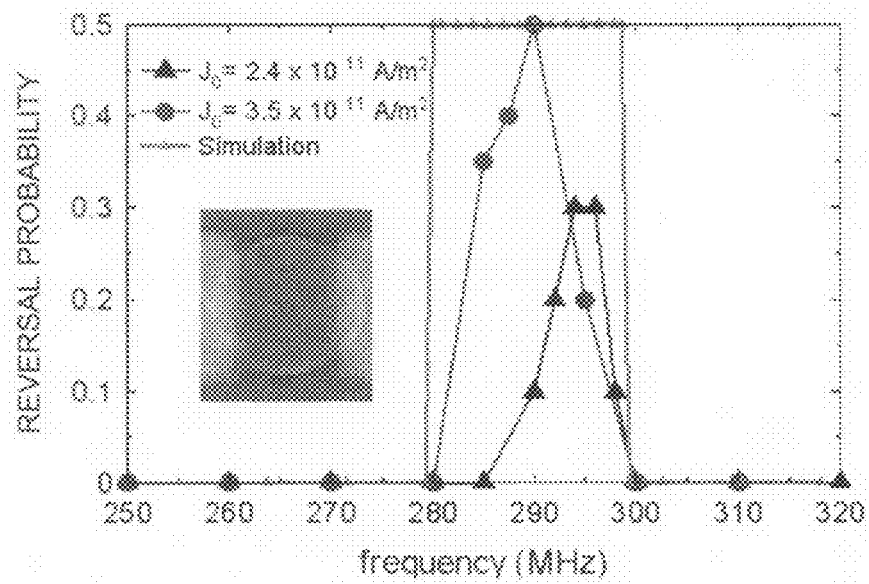
FIG. 15 is a graph illustrating the relationship between the frequency of the current and the reversal probability.

The following experiment was carried out for examining the relationship between the core reversal and the frequency of a supplied current. The aforementioned core reversal experiment was repeated twenty times and the number of times where a reversal was confirmed was counted. The number of reversal times was divided by twenty to obtain a value which is called "a reversal probability," and then the relationship between the frequency of a current and the reversal probability was examined as illustrated in FIG. 15. This figure indicates the reversal probability increases in a certain frequency (resonance frequency) band.

The reversal probability of 0.5 means that a core reversal occurs within less than ten seconds which is a current supply time period. Therefore, it is estimated that as the current density of a supplied current increases, the frequency band in which the value of the reversal probability is 0.5 widens. The validity of this estimation can be confirmed from the comparison between the cases where the current density was $2.4 \times 10^{11}$ A/m$^2$ and where $3.5 \times 10^{11}$ A/m$^2$: the reversal probability of the former case was smaller than that of the latter case. In FIG. 15, in addition, a simulation result in the case where a current with a current density of $3.88 \times 10^{11}$ A/m$^2$ was supplied for 100 ns is superposed as "Simulation." This simulation result also exemplifies that an increase in the current density of a supplied current heightens the probability of the core reversal.

According to the simulation, the smallest current density for a core reversal was calculated to be $2.8 \times 10^{11}$ A/m$^2$, which is very close to the current density of the present experiment, $2.4 \times 10^{11}$ A/m$^2$. This confirms the high accuracy of the simulation.

Figure 16:
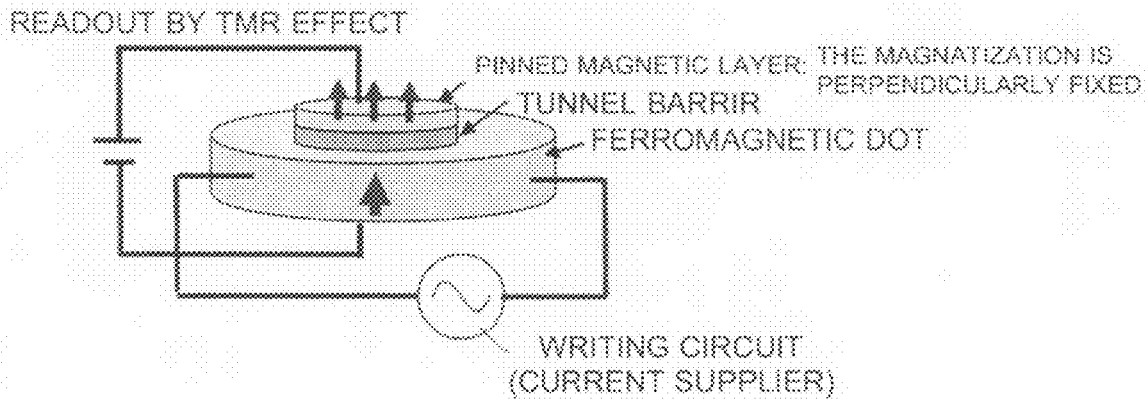
FIG. 16 illustrates an example of the method for reading out the information of the ferromagnetic dot using a TMR element.

Controlling the direction of a core using such a core reversal phenomenon makes it possible to write information in a ferromagnetic dot. The written information can be read out by a conventionally-known method capable of detecting the core direction. For example, as illustrated in FIG. 16, a TMR element composed of the ferromagnetic dot according to the present invention to which a writing circuit (current supplier) is connected, a tunnel barrier, and a pinned magnetic layer enables the information to be read out by the TMR effect.

However, in realizing the binary information record using the core reversal phenomenon, the following problems must be solved.

Figure 17:
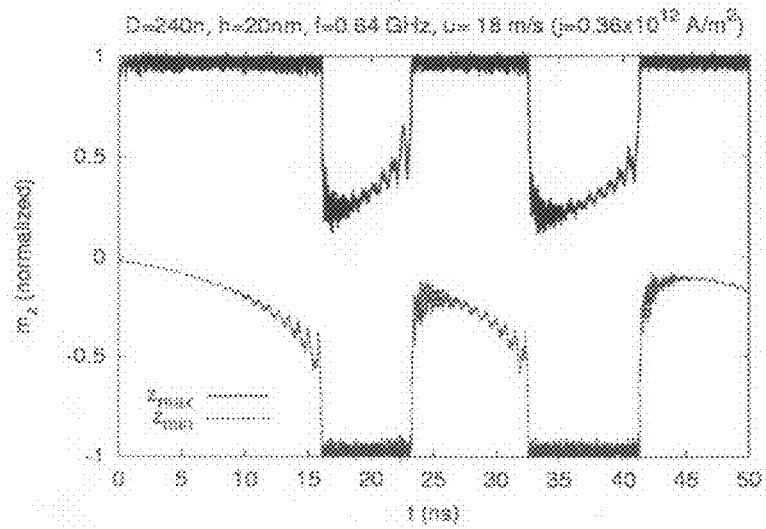
FIG. 17 is a simulation result illustrating the relationship between the lapse time and the maximum value and minimum value of the normalized value of the film thickness direction component of the magnetic moment adjacent to the core in the case where a current is continuously supplied.

1) A continuous supply of a current keeps changing the core direction (upward downward→upward→ . . . , for example). FIG. 17 illustrates the simulation result illustrating the relationship between the lapse time and the maximum value and minimum value of the normalized value of the film thickness direction component of the magnetic moment adjacent to the core in the case where a current was continuously supplied. The length of the magnetic moment was normalized by 1. The maximum value and minimum value of the film thickness direction component of the magnetic moment take the following values: the maximum value of +1 and minimum value of 0 for the core upward with respect to the plane of the dot, and the maximum value of 0 and minimum value of −1 for the core downward with respect to the plane of the dot. In the simulation illustrated in FIG. 17, since the core firstly points upward, the maximum value is +1 and minimum value is 0. Since another downward core appears and grows as time progresses (see FIG. 11), the minimum value decreases as time advances. At the moment in time when the core reverses (approximately at 16 ns) the maximum value is 0 and minimum value is −1. This simulation shows that the core direction continuously changes such as upward→downward→upward→downward . . . as time progresses.

2) Only the reversal can be controlled. It is not possible to specify the upward or downward direction of the core.

Figure 18:
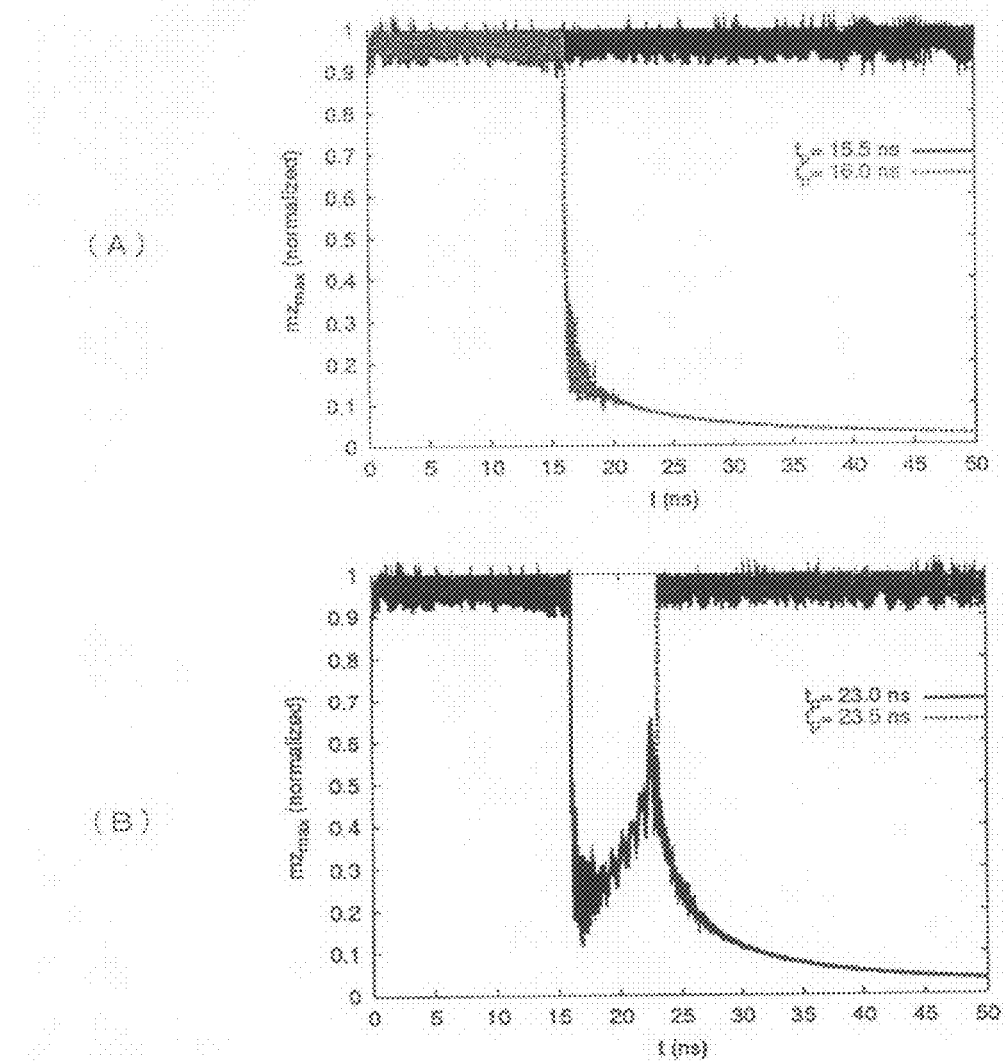
FIG. 18 illustrates graphs each showing the relationship between the lapse time and the maximum value and minimum value of the normalized value of the film thickness direction component of the magnetic moment adjacent to the core, for the current supply times of (A) 15.5 ns and 16.0 ns, and (B) 23.0 ns and 23.5 ns.

One of the possible methods to solve the problem of 1) is to appropriately set the supply time of the current supplied from the current supplier. FIG. 18(A) is a calculation result for a disk-shaped ferromagnetic dot model with a diameter of 240 nm and thickness of 20 nm, illustrating the relationship between the lapse time and the maximum value and minimum value of the normalized value of the film thickness direction component of the magnetic moment adjacent to the core, for the current supply times of 15.5 ns and 16.0 ns (i.e. the current supply is halted 15.5 ns and 16.0 ns after the initiation of the current supply). FIG. 18(B) is the graph for the current supply times of 23.0 ns and 23.5 ns. It is understood that the core reverses only once in the case where the supply time is between 16 and 23 ns. That is, it is possible to reverse the core only once by appropriately controlling the supply time of the current.

In order to solve the problem of 2), it is preferable to examine, before performing a writing, the current core direction by a readout unit, which is composed of a predetermined circuit or other configuration, for reading out the core direction, and to supply the current having a predetermined intensity for a predetermined period of time from the current supplier only in the case where a reversal is required.

Figure 19:
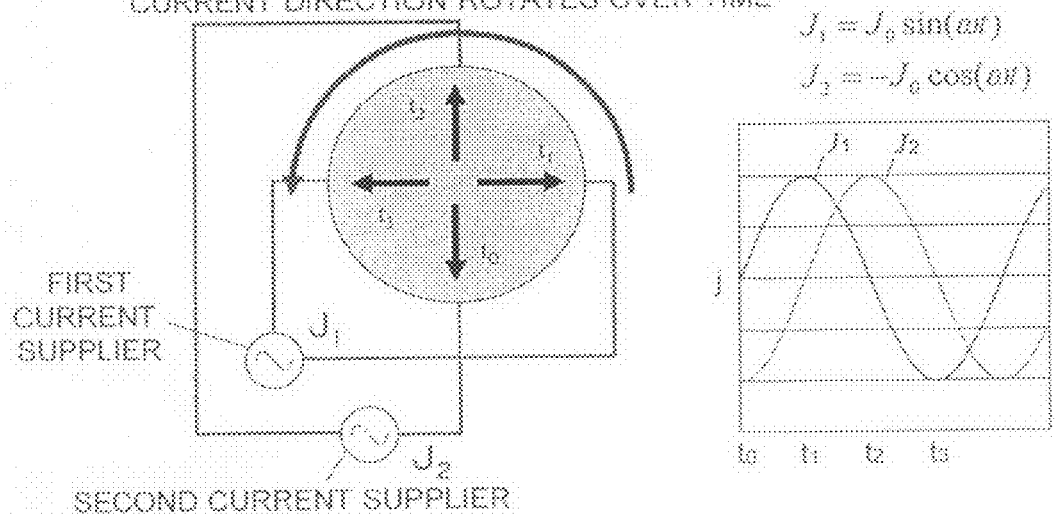
FIG. 19 is a conceptual diagram illustrating the supply of the rotational current to the plane of the ferromagnetic dot.

Another configuration example capable of solving problems 1) and 2) will be described hereinafter. In this configuration, two alternating currents are supplied in the perpendicular directions to each other to produce a flow of rotational current in the plane of the ferromagnetic dot. These two alternating currents are identical but only their phases are shifted by $\pi/2$. FIG. 19 illustrates the conceptual diagram of this configuration. In this configuration, as illustrated in FIG. 19, a first current supplier and a second current supplier are connected to a ferromagnetic dot so that they are substantially mutually-perpendicular in the radial direction. From the first current supplier and the second current supplier, alternating currents $J_1(=J_0 \sin(\omega t))$ and $J_2(=-J_0 \cos(\omega t))$, in which only phases are shifted by $\pi/2$, are supplied. This generates a flow of current whose direction revolves in the ferromagnetic dot's plane. The frequency of the alternating currents $J_1$ and $J_2$ is set to be substantially equal to the resonance frequency of the ferromagnetic dot.

Figure 20:
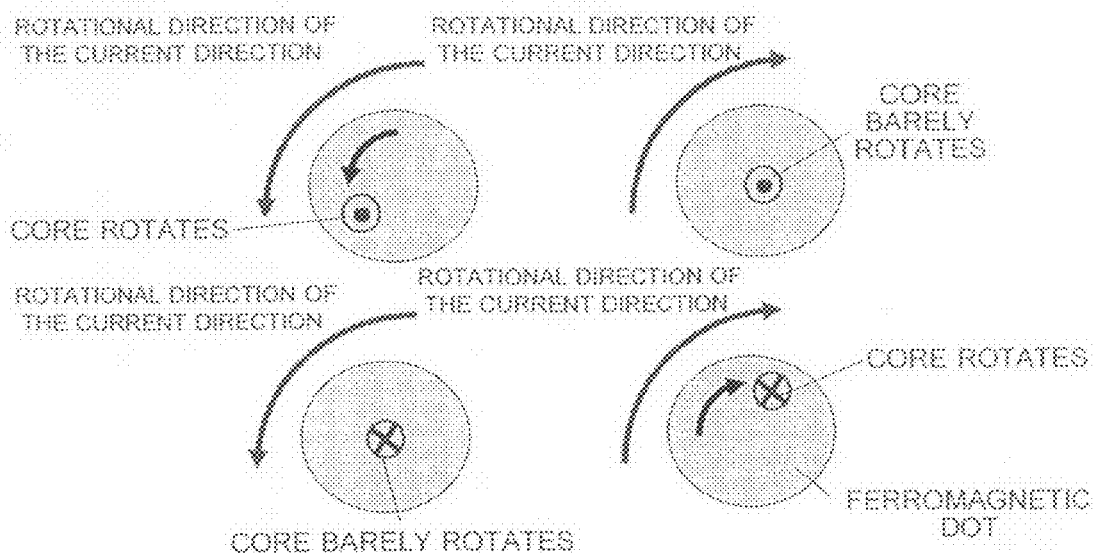
FIG. 20 is a diagram schematically illustrating the core's rotational conditions in accordance with the direction of the rotational current and the core direction.

The combination of the rotational direction of the current in the ferromagnetic dot and the core direction determines whether the core rotates or minimally rotates. "The rotational direction of the current" means in which direction the current's direction rotates and "the core direction" means on which side of the ferromagnetic dot the core exists. FIG. 20 schematically illustrates the core's rotational conditions regarding the rotational direction of the current and the core direction. The core rotates in the same direction of that of the current only in the case where the rotational current is supplied in a counterclockwise direction and where the current is identical (or close) to the resonance frequency. The core minimally rotates in different combinations.

When the core's rotational velocity exceeds a certain threshold value, the core reverses to the opposite side. The core which has reversed and moved to the opposite side will not be rotated by the present current. That is, the core direction will be fixed.

As in the manner just described, it is possible to specify the core direction by the rotational direction of a current. For example, in order to record "1," a current may be supplied so that the current supplied from the first current supplier and the second current supplier is rotated in a counterclockwise direction in the ferromagnetic dot (for example, using currents of $J_1=J_0 \sin(\omega t)$ and $J_2=J_0 \cos(\omega t)$). In order to record "0," a current may be supplied so that the current supplied from the first current supplier and the second current supplier is rotated in a clockwise direction in the ferromagnetic dot (for example, using currents of $J_1=J_0 \sin(\omega t)$ and $J_2=-J_0 \cos(\omega t)$). It is possible to know which direction the core points, i.e. whether the recorded information is "1" or "0," by providing a readout unit for reading out a direction of the core. In the present invention, the readout unit may be configured in any way: the TMR effect may be used for example.

Based on the simulation carried out by the inventors of the present invention, in the case where the core direction is controlled by using a rotational current, the threshold value of a current density required for a core reversal is half as much as that in the case where a current is supplied to a ferromagnetic dot by a single current supplier, which was described earlier. This method has an advantage in that it is not necessary to precisely control the current supply time.

(Application to a Logic Element)

Figure 21:
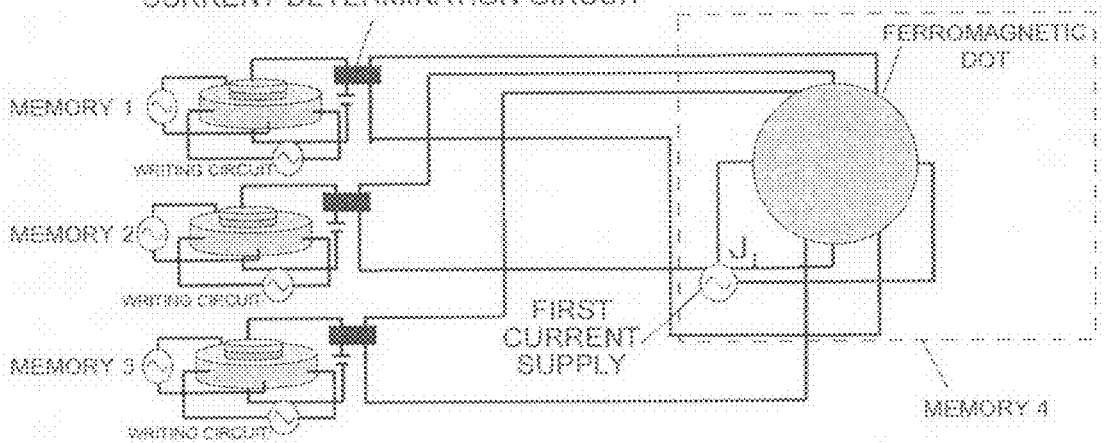
FIG. 21 is a diagram illustrating a configuration example of a majority logic circuit using a TMR element using the ferromagnetic dot according to the present invention.

A logic circuit element can also be created using the core reversal property of the ferromagnetic dot according to the present invention. That is, it is possible to obtain a logic circuit element by providing a plurality of the information memory elements using the core of a ferromagnetic dot, and a current to be supplied to an information memory element using the core of a ferromagnetic dot for determination is decided based on binary information read out from each information memory element using the core of a ferromagnetic dot. As its one example, the configuration of a majority logic circuit using a TMR element is illustrated in FIG. 21. In FIG. 21, the readout circuit for the memory 4 is omitted.

A current determination circuit for determining the current to be generated based on the information read out is added to each of the memories 1 through 3. For example, the current determination circuit generates a current proportional to cos ($\omega t$) in the case where the readout information is "1" and generates a current proportional to $-\cos(\omega t)$ in the case where the readout information is "0." For each of the memories 1 through 3, wiring is installed so that the direction of the current provided from the current determination circuit is approximately orthogonal to the direction of the current, $J_1(=\sin(\mu t))$, supplied by the first current supplier which is provided for the memory 4. With this configuration, the input current to the memory 4 is determined by the values, i.e. the core directions, recorded in the memories 1 through 3, and the core direction of the memory 4 is determined corresponding to the most frequently appearing value among the values read out from the memories 1 through 3.

Figure 22:
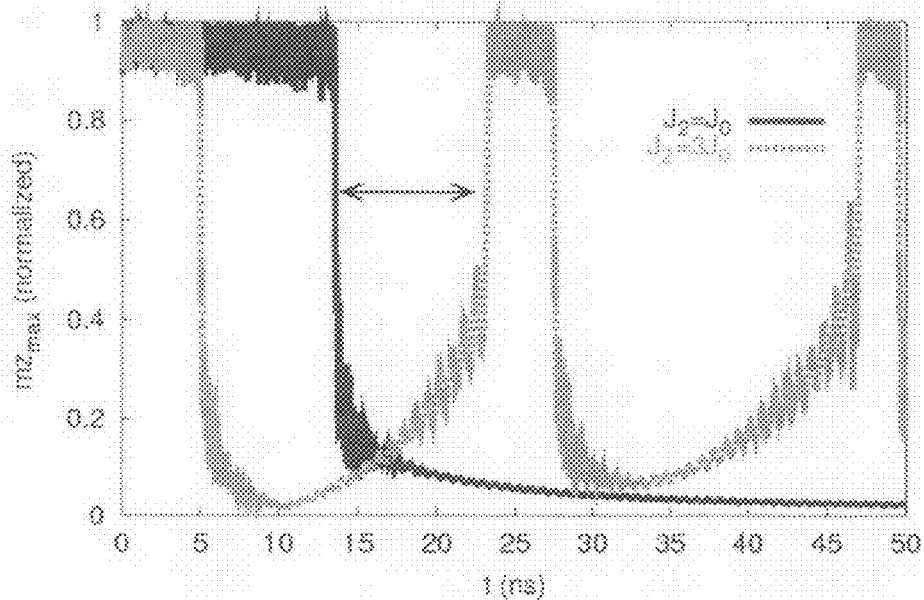
FIG. 22 is a graph illustrating the relationship between the lapse time and the maximum value and minimum value of the normalized value of the film thickness direction component of the magnetic moment adjacent to the core, in the cases where $J_2=J_0$ and $J_2=3J_0$.

In the case where the memories 1 through 3 have the same value in the aforementioned configuration or the like for example, a current may be excessively (up to three times) supplied and the core may possibly reverse continuously. FIG. 22 is a graph illustrating the relationship between the lapse time and the maximum value and minimum value of the normalized value of the film thickness direction component of the magnetic moment adjacent to the core, in the cases where $J_2=J_0$ and $J_2=3J_0$. In this figure, $J_2$ is the sum of the currents provided from the current determination circuits of the memories 1 through 3, i.e. the configuration illustrated in FIG. 21 is used as the model.

In order to prevent this problem, the current supply time may be controlled. In the configuration of FIG. 21, for simplifying the explanation, i.e. if the current input from the memories 1 through 3 is $J_2$, it is necessary to control the current supply time so that it should be between the time required for a core reversal in the case where $J_2=J_0$ and the time required for a core reversal in the case where $J_2=3J_0$. That is, it should be set between the period indicated by the double arrow in FIG. 22.

(Pear-Shaped Ferromagnetic Dot)

The inventors of the present invention have discovered, as a result of further research on the ferromagnetic dot, that a specific phenomenon regarding a core appears under certain conditions, which will be described later, in a ferromagnetic dot having a planar shape in which two disk-shaped ferromagnetic dots with a magnetic vortex structure are partially overlapped and connected. In the present specification, the ferromagnetic dot having such a shape is called "a pear-shaped ferromagnetic dot." Each size of the two dots composing a pear-shaped ferromagnetic dot may preferably be substantially the same from each other.

Although a pear-shaped ferromagnetic dot may not necessarily be formed with two dots, an explanation will be made on the presumption that two dots, the first dot and second dot, are overlapped, for convenience of the explanation. The first dot and second dot are disk-shaped, whose concept includes an ellipse. Some irregularities on the edge of the disk may be allowed.

Figure 23:
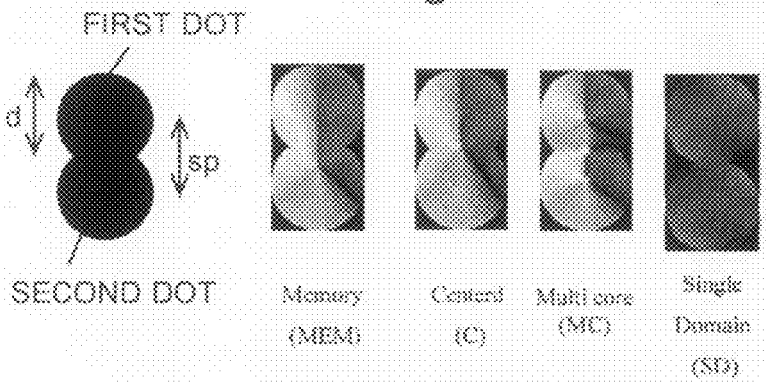
FIG. 23 is a distribution map illustrating the core's manifestation condition for the various distances between the centers of the first dot and second dot, and for the various thicknesses of the dots in a pear-shaped ferromagnetic dot.
Figure 23:
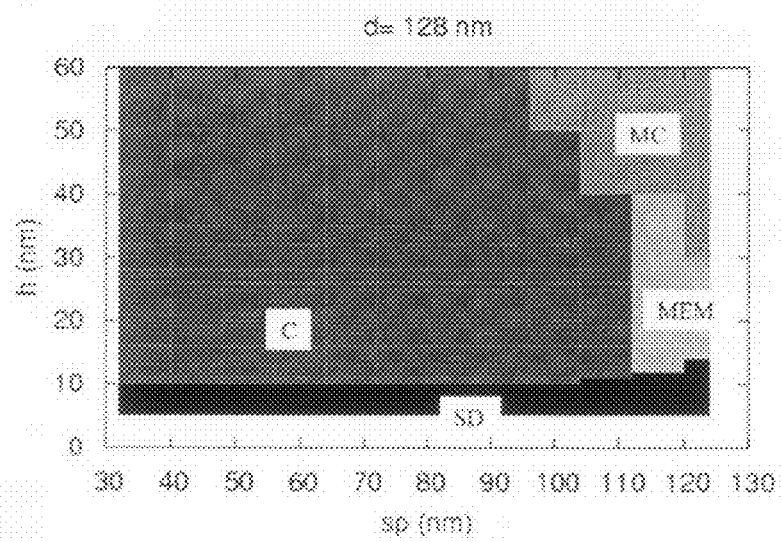

In a pear-shaped ferromagnetic dot, the core's manifestation condition differs in accordance with the overlap degree (sp) of the first dot and second dot and the dot's thickness (h). FIG. 23 is a distribution map illustrating the core's manifestation condition for various distances sp between the centers of the first dot and second dot and for various thicknesses h of the pear-shaped ferromagnetic dot, provided that the first and second dots both have a diameter of 120 nm. In this simulation, material constants of permalloy were used. In the distribution map of FIG. 23, MEM denotes the condition that only one core is generated and the core is located in either the first dot or second dot in the stable state, C denotes the condition that only one core is generated and the core is located on a joining area of the first dot and second dot, MC denotes the condition that three cores are generated, and SD denotes the condition that no core is generated. In the present invention, a pear-shaped ferromagnetic dot of the MEM state is used among these states. When in the stable state (i.e. when no current is supplied and no magnetic field is applied), a pear-shaped ferromagnetic dot made of permalloy is in the MEM state if the shape of the pear-shaped ferromagnetic dot approximately satisfies the conditions of d>=96 nm, h=10 through 40 nm, 0.69d+19<=sp<d.

Figure 24:
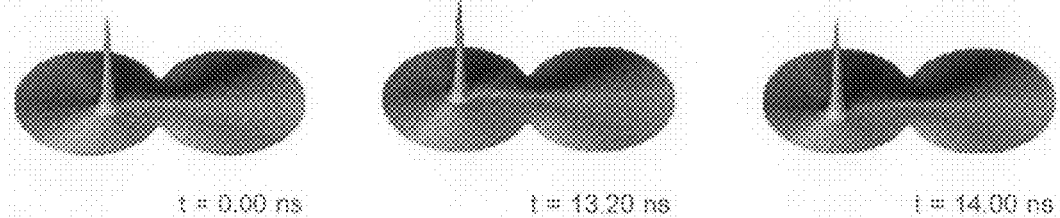
FIG. 24 is a diagram illustrating the process in which the core moves to another dot.

In the case where the pear-shaped ferromagnetic dot satisfies the MEM condition, the core generally stops in the center of the first dot or that of the second dot. If an alternating current whose frequency is substantially the same as the resonance frequency of the dot is supplied to the radial direction of at least the dot in which the core exists between the first dot or second dot of the pear-shaped ferromagnetic dot, the core starts rotating as in the case of a ferromagnetic dot which was described earlier. The resonance frequency of a pear-shaped ferromagnetic dot has a tendency to be lower than that of a simple ferromagnetic dot. FIG. 24 illustrates the simulation result of the core movement as time advances in this case. In the simulation, a pear-shaped ferromagnetic dot was used whose first dot and second dot had a diameter of D=256 nm and a thickness of h=10 nm, and the distance between the centers was sp=232 nm. To this pear-shaped ferromagnetic dot, an alternating current was supplied having a current density of $j=0.12 \times 10^{12}$ A/m$^2$, and a frequency of f=0.25 GHz. FIG. 24 also illustrates the trajectory of the core. As is understood from FIG. 24, the following phenomenon occurs: the rotational radius of the core gradually becomes larger and when it exceeds a certain radius, the core passes the junction of the first dot and second dot to move into another dot side (first dot→second dot, or second dot→first dot).

In order to move a core into another dot, since the core has only to rotate with a diameter not smaller than a given rotational radius, a direct current may be used in place of an alternating current, or an alternating current magnetic field may be applied with a resonance frequency which resonates with the rotational period of the core.

Figure 25:
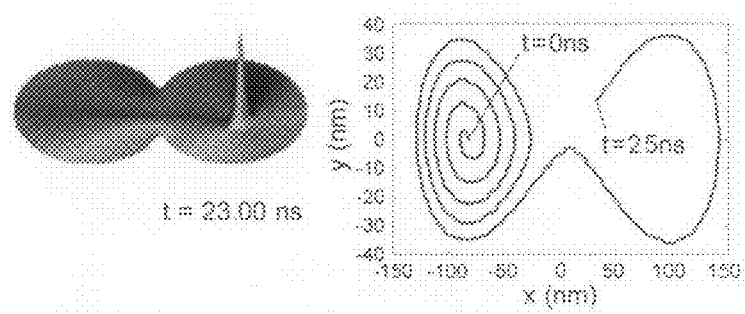
FIG. 25 is a schematic diagram of the record of binary information with a pear-shaped ferromagnetic dot.

Using the aforementioned phenomenon, as illustrated in FIG. 25, it is possible to record and read out binary information based on whether the core exists in the first dot side or second dot side. For example, in the case where the core exists in the first dot, the value may be "0," and in the case where the core exists in the second dot, the value may be "1."

Figure 26:
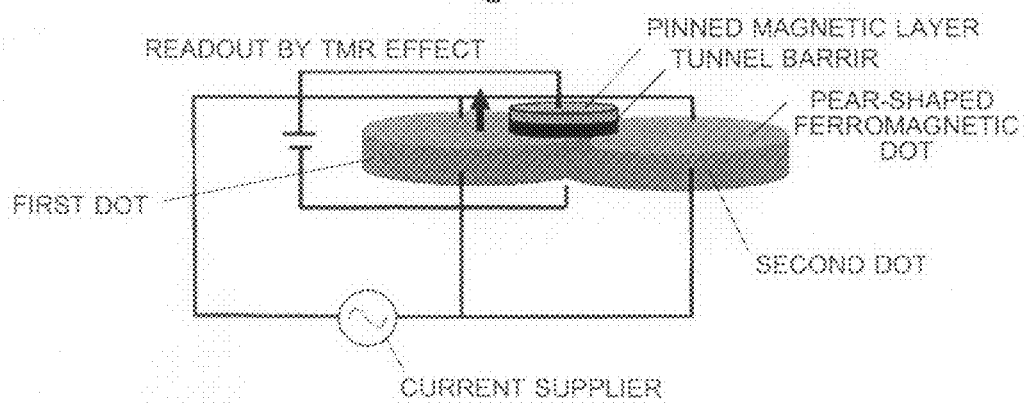
FIG. 26 illustrates an example of the method for reading out the information of the pear-shaped ferromagnetic dot using a TMR element.

The method for writing information, i.e. the supply of an alternating current, and the method for reading out the information may be in any manner. For example, as illustrated in FIG. 26, a writing unit may be provided by placing a current supplier for supplying the same alternating current to each of the first dot and second dot of a pear-shaped ferromagnetic dot, and a tunnel barrier and a pinned magnetic layer may be provided on the joining area of the first dot and second dot. With this configuration, an information readout can be performed using the TMR effect by performing a readout in the layer direction including the pear-shaped ferromagnetic dot, because the magnetization direction in the joining area of the first dot and second dot is opposite between the case where the core exists in the first dot and the case where it exists in the second dot.

However, writing binary information by using a pear-shaped ferromagnetic dot has the following problems:

1) If a current is continuously provided from the current supplier, the core continuously moves between the dots (first dot→second dot→first dot→ . . . ).

2) It is not possible to specify which dot between the first dot and second dot the core moves to (first dot→second dot, or second dot→first dot).

In order to solve problem 1), the current supply time may be controlled so that the current supply should be halted after the core moves to another dot only once and before the core moves once more (returns to the original core).

In order to solve problem 2), the information may be first read out before writing information, and a current may be supplied to rewrite only in the case where a rewriting is required.

Figure 27:
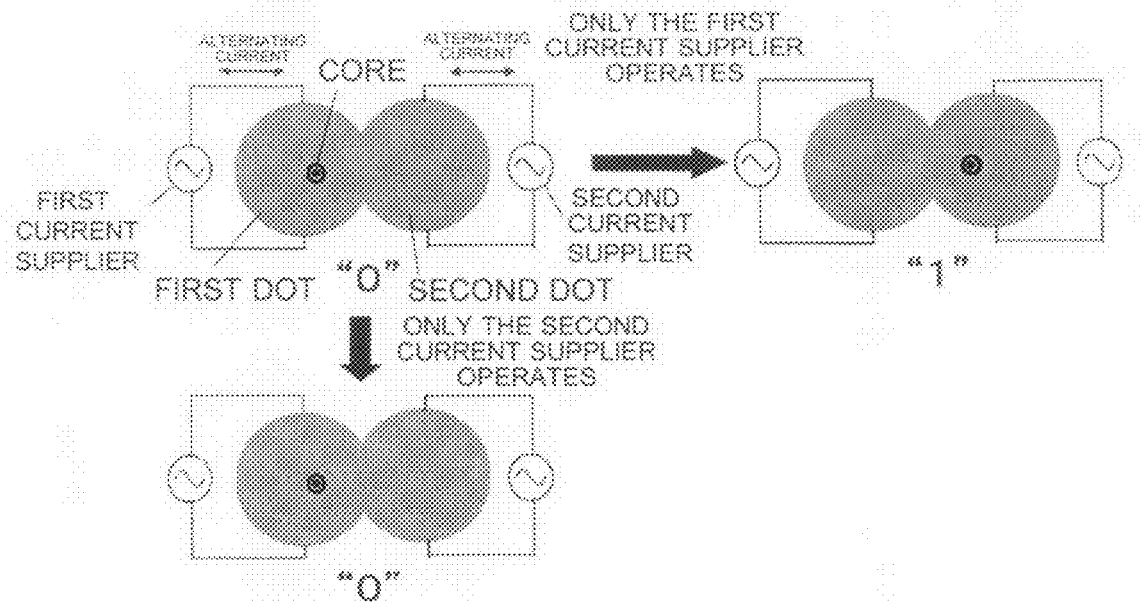
FIG. 27 is a conceptual diagram illustrating a method for controlling the core's transfer in a pear-shaped ferromagnetic dot.

A configuration example capable of solving the problems 1) and 2) at the same time regarding the pear-shaped ferromagnetic dot will be explained with reference to FIG. 27. A current supplier may be independently provided to the first dot and second dot. These current suppliers are called the first current supplier and second current supplier. A current may be only supplied from the current supplier to the dot from which the core is to go out. In the example of FIG. 27, the core first exists in the first dot. However, it should be noted that in the present configuration the core location after a current supply is independent of which dot the core originally exists in. To place the core in the second dot, only the first current supplier is operated to supply an alternating current at a resonance frequency only to the first dot. This moves the core to the second dot. Inversely, in order to move the core to the first dot, an alternating current at a resonance frequency may be supplied from the second current supplier.

This method also illustrates the advantage that there is no necessity to control the current supply time.

(Property Difference Depending on the Material of a Ferromagnetic Dot)

Figure 28:
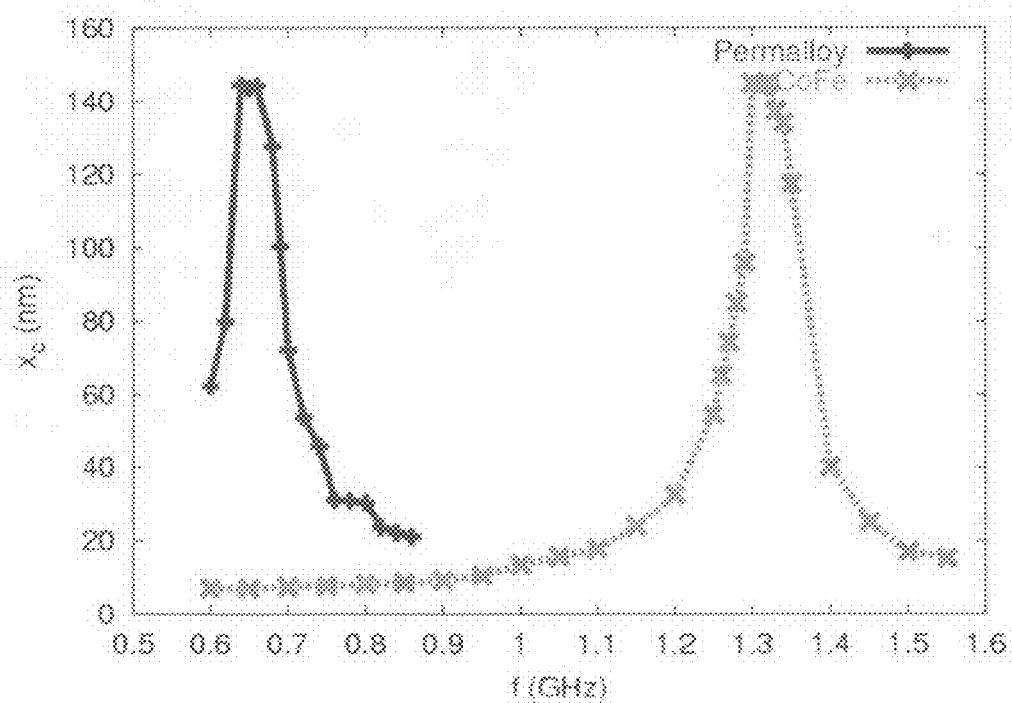
FIG. 28 is a graph illustrating the resonance characteristics of permalloy and CoFe.

Thus far, a ferromagnetic dot and pear-shaped ferromagnetic dot according to the present invention have been explained centering on those made of permalloy. For comparison, the inventors of the present invention have calculated the resonance property of the core of a ferromagnetic dot made of CoFe (Ms=1600 emu/cm$^3$) as a ferromagnetic material other than permalloy. FIG. 28 is a graph illustrating the resonance properties of permalloy and CoFe. This shows that the resonance frequency of CoFe is twice as high as that of permalloy. The current value of permalloy was $j=0.40 \times 10^{12}$ A/m$^2$ and that of CoFe was $j=0.80 \times 10^{12}$ A/m$^2$, which indicates that, for CoFe, a current with a density approximately twice as much as that for permalloy is required to obtain a comparable level of amplitude. Also for a pear-shaped ferromagnetic dot made of CoFe, the resonance frequency has to be twice as high as that for permalloy, and the current for the record also has to be twice as much.

Figure 29:
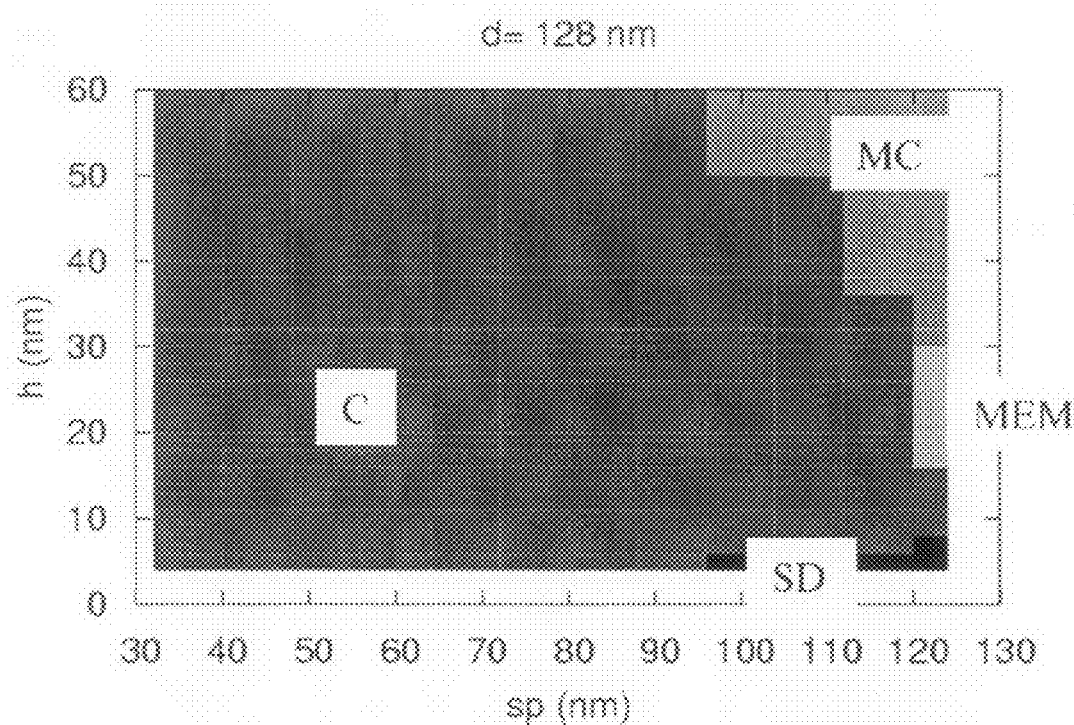
FIG. 29 is a distribution map illustrating the core's manifestation condition for various distances between the centers of the first dot and second dot, and for various thicknesses of the dots in a pear-shaped ferromagnetic dot made of CoFe.

The core's manifestation condition for a pear-shaped ferromagnetic dot made of CoFe for the various distances between the centers of the first dot and second dot, and for the various thicknesses of the dots of a pear-shaped ferromagnetic dot was examined. The resulting distribution map is illustrated in FIG. 29. This shows that the size conditions to be operable as a memory, i.e. the area of MEM in FIG. 29, is severe for CoFe as the material compared to permalloy.

Thus far, the core-rotating element of a ferromagnetic dot according to the present invention and the element using a ferromagnetic dot have been explained with embodiments. It should be noted that these are merely examples and any modification and improvement can be appropriately performed within the spirit of the present invention.

The invention claimed is:

1. A core-rotating element of a ferromagnetic dot, comprising:
   a ferromagnetic dot, made of a disk-shaped ferromagnetic material, with a magnetic structure of a magnetic vortex structure; and
   a current supplier for supplying, in a radial direction of the ferromagnetic dot, an alternating current with a substantially same frequency as a resonant frequency of the ferromagnetic dot.

2. The core-rotating element of a ferromagnetic dot according to claim 1, wherein the ferromagnetic dot has a planar shape of a substantially circular form with a diameter of not more than 50 μm and has a thickness of not more than 1 μm.

3. An actuator using a leakage magnetic field of the core of the core-rotating element of a ferromagnetic dot according to claim 2.

4. A tunnel magnetoresistance (TMR) element in which an insulator is provided on the ferromagnetic dot of the core-rotating element of a ferromagnetic dot according to claim 3, and a magnetic material is provided on a predetermined partial area of the insulator.

5. A transistor using the TMR element according to claim 4, for amplifying a voltage at a predetermined frequency.

6. An actuator using a leakage magnetic field of the core of the core-rotating element of a ferromagnetic dot according to claim 1.

7. A tunnel magnetoresistance (TMR) element in which an insulator is provided on the ferromagnetic dot of the core-rotating element of a ferromagnetic dot according to claim 1, and a magnetic material is provided on a predetermined partial area of the insulator.

8. A transistor using the TMR element according to claim 7, for amplifying a voltage at a predetermined frequency.

9. A core-reversing control element of a ferromagnetic dot comprising:
a ferromagnetic dot, made of a disk-shaped ferromagnetic material, with a magnetic structure of a magnetic vortex structure;
a first current supplier for supplying, in a radial direction of the ferromagnetic dot, an alternating current with a substantially same frequency as a resonant frequency of the ferromagnetic dot; and
a second current supplier for supplying another alternating current, in which only a phase is shifted by $\pi/2$ with respect to the alternating current supplied from the first current supplier, to the ferromagnetic dot in a direction substantially orthogonal to a current supply direction by the first current supplier.

10. The core-reversing control element of a ferromagnetic dot according to claim 9, wherein the ferromagnetic dot has a planar shape of a substantially circular form with a diameter of not more than 50 μm and has a thickness of not more than 1 μm.

11. An information memory element using a core of a ferromagnetic dot, comprising:
the core-reversing control element of a ferromagnetic dot according to claim 10; and
a readout unit for reading out a direction of the core.

12. A logic circuit element comprising a plurality of the information memory elements using a core of a ferromagnetic dot according to claim 11, wherein a current to be provided to an information memory element using a core of a ferromagnetic dot for determination is determined based on binary information read out from each of the information memory elements using a core of a ferromagnetic dot.

13. An information memory element using a core of a ferromagnetic dot, comprising:
the core-reversing control element of a ferromagnetic dot according to claim 9; and
a readout unit for reading out a direction of the core.

14. A logic circuit element comprising a plurality of the information memory elements using a core of a ferromagnetic dot according to claim 13, wherein a current to be provided to an information memory element using a core of a ferromagnetic dot for determination is determined based on binary information read out from each of the information memory elements using a core of a ferromagnetic dot.

15. An information memory method using a core of a ferromagnetic dot, for expressing binary information by a direction of a core of a ferromagnetic dot which is made of a disk-shaped ferromagnetic material and has a magnetic structure of a magnetic vortex structure, wherein:
a direction of the core of the ferromagnetic dot is reversed by supplying, in a radial direction of the ferromagnetic dot, an alternating current with a substantially same frequency as a resonant frequency of the ferromagnetic dot with a predetermined current density.

16. An information memory method using a core of a ferromagnetic dot, for expressing binary information by a direction of a core of a ferromagnetic dot which is made of a disk-shaped ferromagnetic material and has a magnetic structure of a magnetic vortex structure, wherein:
a rotational current is generated in the ferromagnetic dot to control a direction of the core by supplying, to the ferromagnetic dot, an alternating current with a substantially same frequency as a resonant frequency of the ferromagnetic dot and another alternating current in which only a phase is shifted by $\pi/2$ or $-\pi/2$ with respect to the alternating current, with a predetermined current density.

17. An information memory element using a core of a ferromagnetic dot, comprising:
a pear-shaped ferromagnetic dot having a planar shape in which a first dot and a second dot, each of which is a disk-shaped ferromagnetic dot with a magnetic structure of a magnetic vortex structure, are partially overlapped;
a current supplier for supplying an alternating current with a predetermined frequency both in a radial direction of the first dot and in a radial direction of the second dot;
an insulator layer provided on a joining area of the first dot and the second dot; and
a magnetic material layer provided on a predetermined partial area on the insulator.

18. The information memory element using a core of a ferromagnetic dot according to claim 17, wherein the pear-shaped ferromagnetic dot has a shape in which, in a stable state, only one core exists either in the first dot or in the second dot.

19. An information memory element using a core of a ferromagnetic dot, comprising:
a pear-shaped ferromagnetic dot having a planar shape in which a first dot and a second dot, each of which is a disk-shaped ferromagnetic dot with a magnetic structure of a magnetic vortex structure, are partially overlapped;
a first current supplier for supplying, in a radial direction of the first dot, an alternating current with a substantially same frequency as a resonance frequency of the first dot;
a second current supplier for supplying, in a radial direction of the second dot, an alternating current with a substantially same frequency as a resonance frequency of the first dot;
an insulator layer provided on a joining area of the first dot and the second dot; and
a magnetic material layer provided on a predetermined partial area on the insulator.

20. The information memory element using a core of a ferromagnetic dot according to claim 19, wherein the pear-shaped ferromagnetic dot has a shape in which in a stable state only one core exists either in the first dot or in the second dot.

21. An information memory method using a core of a pear-shaped ferromagnetic dot having a planar shape in which a first dot and a second dot, each of which is a disk-shaped ferromagnetic dot with a magnetic structure of a magnetic vortex structure, are partially overlapped, for expressing binary information based on whether the core exists in the first dot or in the second dot, wherein:
an existence position of the core is determined to be either in the first dot or the second dot by supplying an alternating current with a predetermined frequency to the first dot or the second dot.

* * * * *